(12) United States Patent
Lee et al.

(10) Patent No.: US 12,150,349 B2
(45) Date of Patent: Nov. 19, 2024

(54) ORGANIC LIGHT-EMITTING DISPLAY DEVICE AND METHOD OF MANUFACTURING THE SAME

(71) Applicant: Samsung Display Co., LTD., Yongin-si (KR)

(72) Inventors: Hyoungsub Lee, Yongin-si (KR); Sooyoun Kim, Siheung-si (KR); Wooyong Sung, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 165 days.

(21) Appl. No.: 17/879,324

(22) Filed: Aug. 2, 2022

(65) Prior Publication Data
US 2022/0367584 A1 Nov. 17, 2022

Related U.S. Application Data

(63) Continuation of application No. 16/854,063, filed on Apr. 21, 2020, now Pat. No. 11,424,305, which is a
(Continued)

(30) Foreign Application Priority Data

Feb. 8, 2018 (KR) .................. 10-2018-0015724

(51) Int. Cl.
*H10K 59/122* (2023.01)
*H10K 50/842* (2023.01)
(Continued)

(52) U.S. Cl.
CPC ....... *H10K 59/122* (2023.02); *H10K 50/8426* (2023.02); *H10K 50/844* (2023.02);
(Continued)

(58) Field of Classification Search
CPC ............. H10K 59/122; H10K 50/8426; H10K 50/844; H10K 50/8445; H10K 59/124;
(Continued)

(56) References Cited

U.S. PATENT DOCUMENTS

| 2013/0248867 A1 | 9/2013 | Kim et al. |
| 2016/0064461 A1 | 3/2016 | Lee et al. |

(Continued)

FOREIGN PATENT DOCUMENTS

| KR | 10-2011-0125546 | 11/2011 |
| KR | 10-2016-0064373 | 6/2016 |

(Continued)

OTHER PUBLICATIONS

Korean Notice of Allowance for Korean Patent Application or Patent No. 10-2018-0015724, dated Mar. 13, 2022.

*Primary Examiner* — Farun Lu
(74) *Attorney, Agent, or Firm* — KILE PARK REED & HOUTTEMAN PLLC

(57) ABSTRACT

An organic light-emitting display device includes a substrate having a display area surrounding a through area, and a peripheral area between the through and display areas, a light-emitting element on the display area, a first dam on the peripheral area and surrounding the through area, a first protruding pattern on the first dam and protruding toward the display area from the first dam to define an undercut region, a boundary portion extending from the display area toward the first dam, the boundary portion being spaced apart from the first dam to define a first receiving space therebetween, and an encapsulation layer continuously extending from the display area to the peripheral area, the encapsulation layer including at least one organic layer with a first filling portion filling at least part of the first receiving space and protruding toward the first dam to be aligned with the undercut region.

15 Claims, 22 Drawing Sheets

Related U.S. Application Data continuation of application No. 16/254,815, filed on Jan. 23, 2019, now Pat. No. 10,644,087.

(51) Int. Cl.
*H10K 50/844* (2023.01)
*H10K 59/12* (2023.01)
*H10K 59/124* (2023.01)
*H10K 71/00* (2023.01)

(52) U.S. Cl.
CPC ....... *H10K 50/8445* (2023.02); *H10K 59/124* (2023.02); *H10K 71/00* (2023.02); *H10K 59/1201* (2023.02)

(58) Field of Classification Search
CPC .... H10K 71/00; H10K 59/1201; H10K 59/12; H10K 50/84; H10K 59/00; H10K 59/8722; H10K 59/8731
See application file for complete search history.

(56) References Cited

U.S. PATENT DOCUMENTS

| | | |
|---|---|---|
| 2017/0003800 A1 | 1/2017 | Zhu |
| 2017/0033312 A1 | 2/2017 | Kim et al. |
| 2017/0148856 A1* | 5/2017 | Choi .................. H10K 59/124 |
| 2017/0345911 A1 | 11/2017 | Yu et al. |
| 2018/0069063 A1 | 3/2018 | Kim et al. |

FOREIGN PATENT DOCUMENTS

| | | |
|---|---|---|
| KR | 10-2016-0087982 | 7/2016 |
| KR | 10-2016-0108800 | 9/2016 |
| KR | 10-2017-0012707 | 2/2017 |
| KR | 10-2017-0059864 | 5/2017 |
| KR | 10-2017-0135510 | 12/2017 |

* cited by examiner

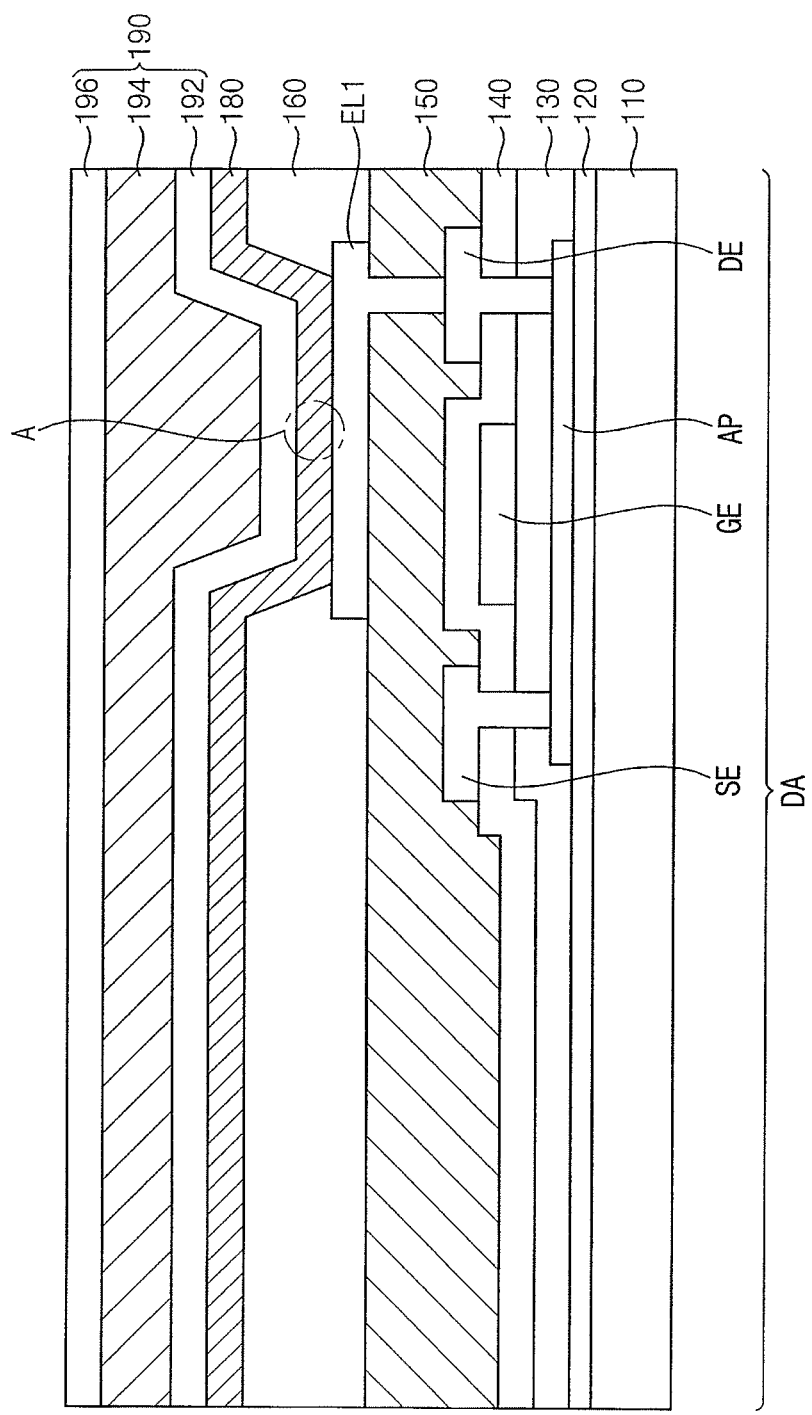

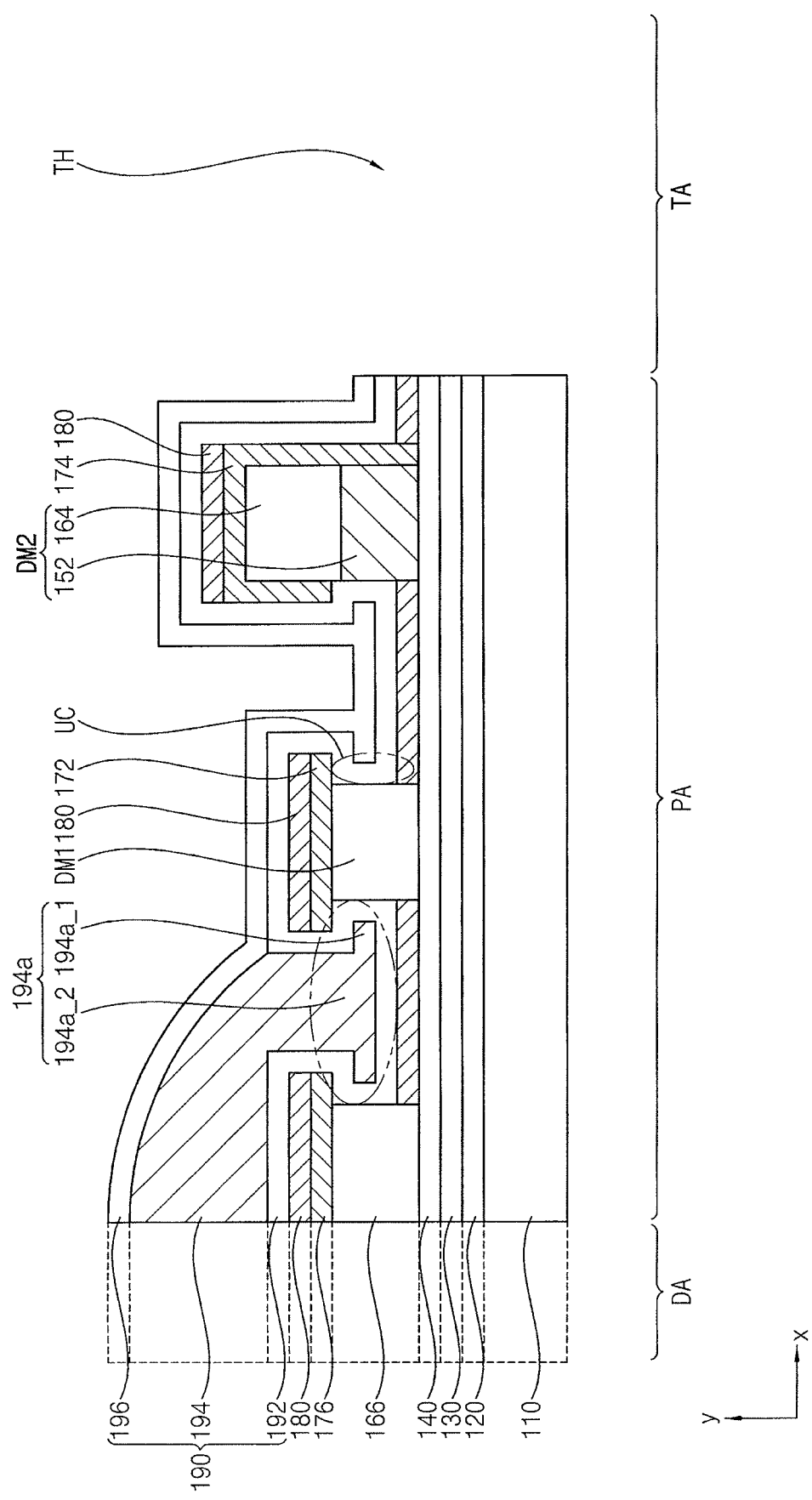

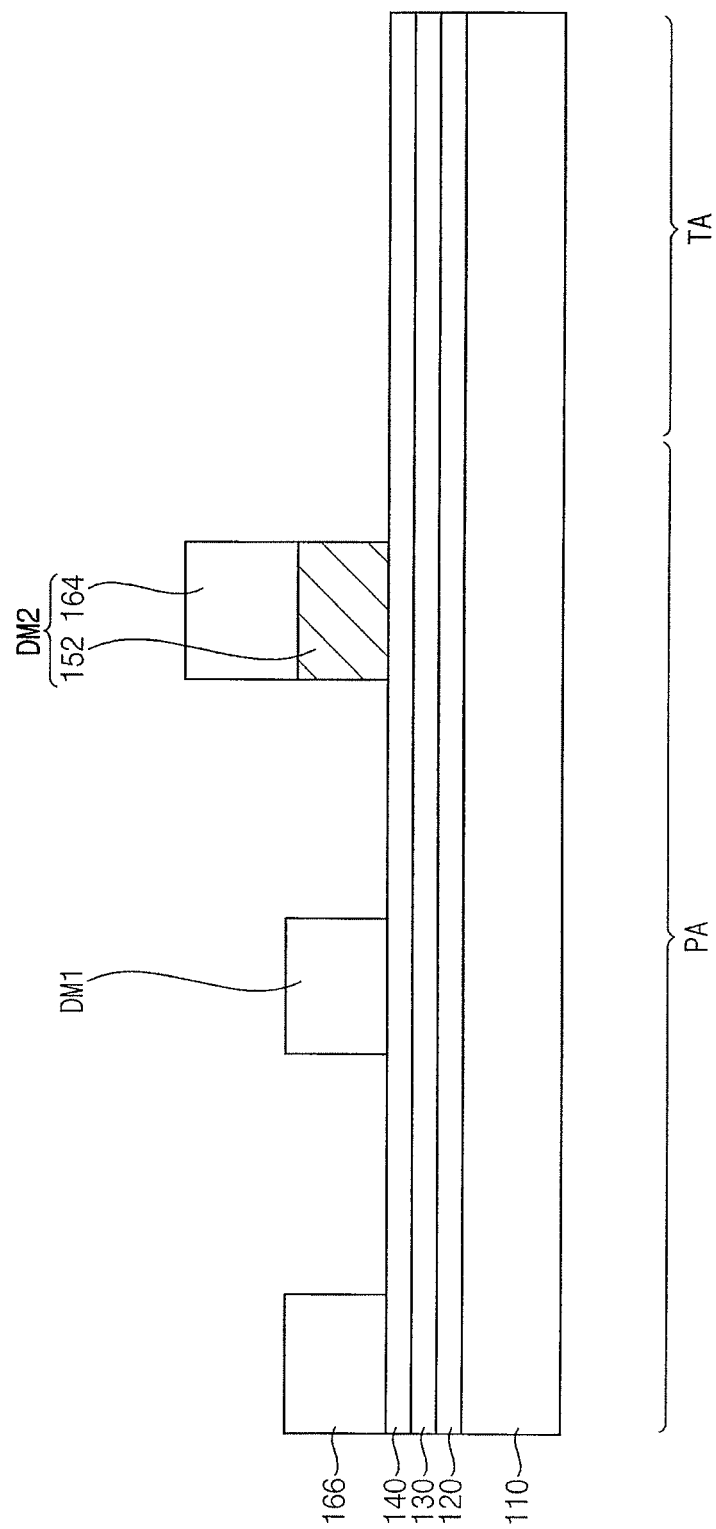

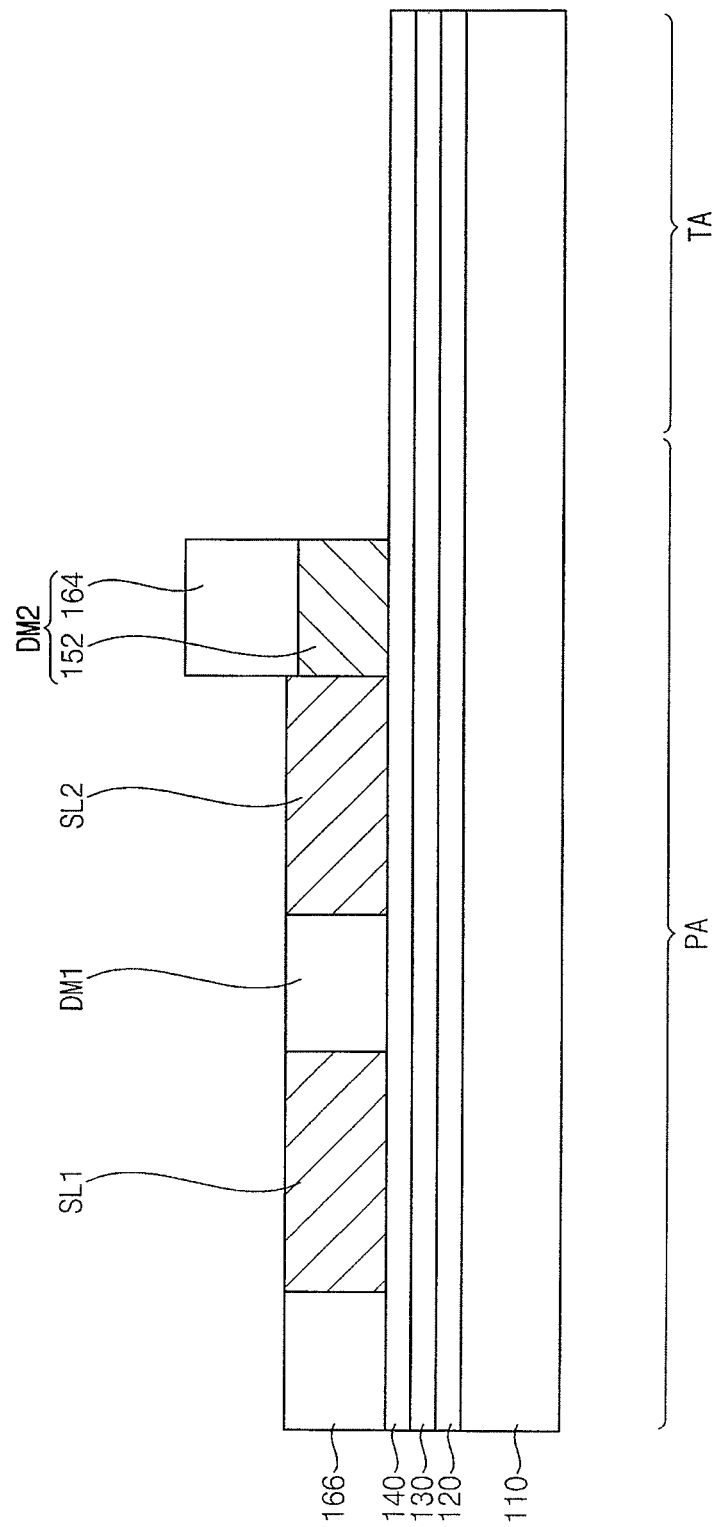

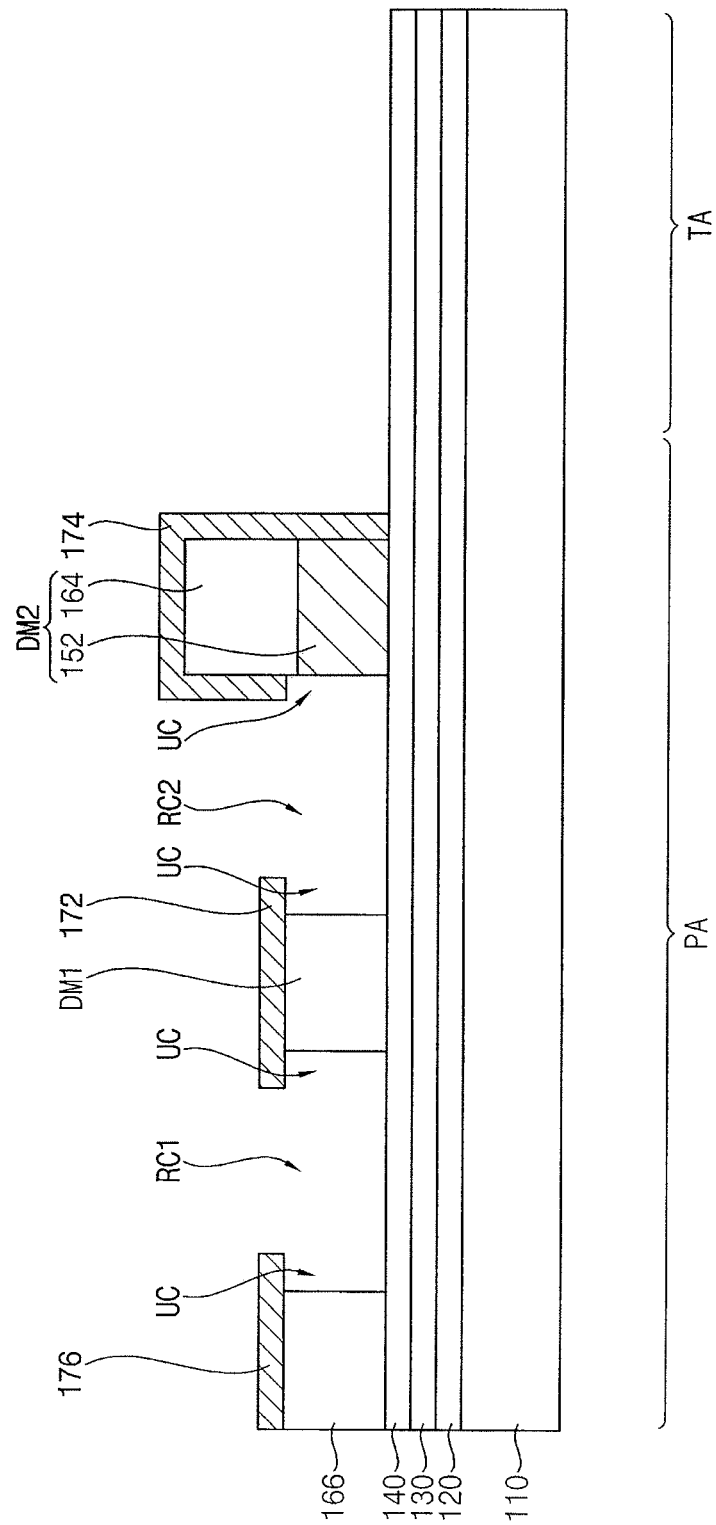

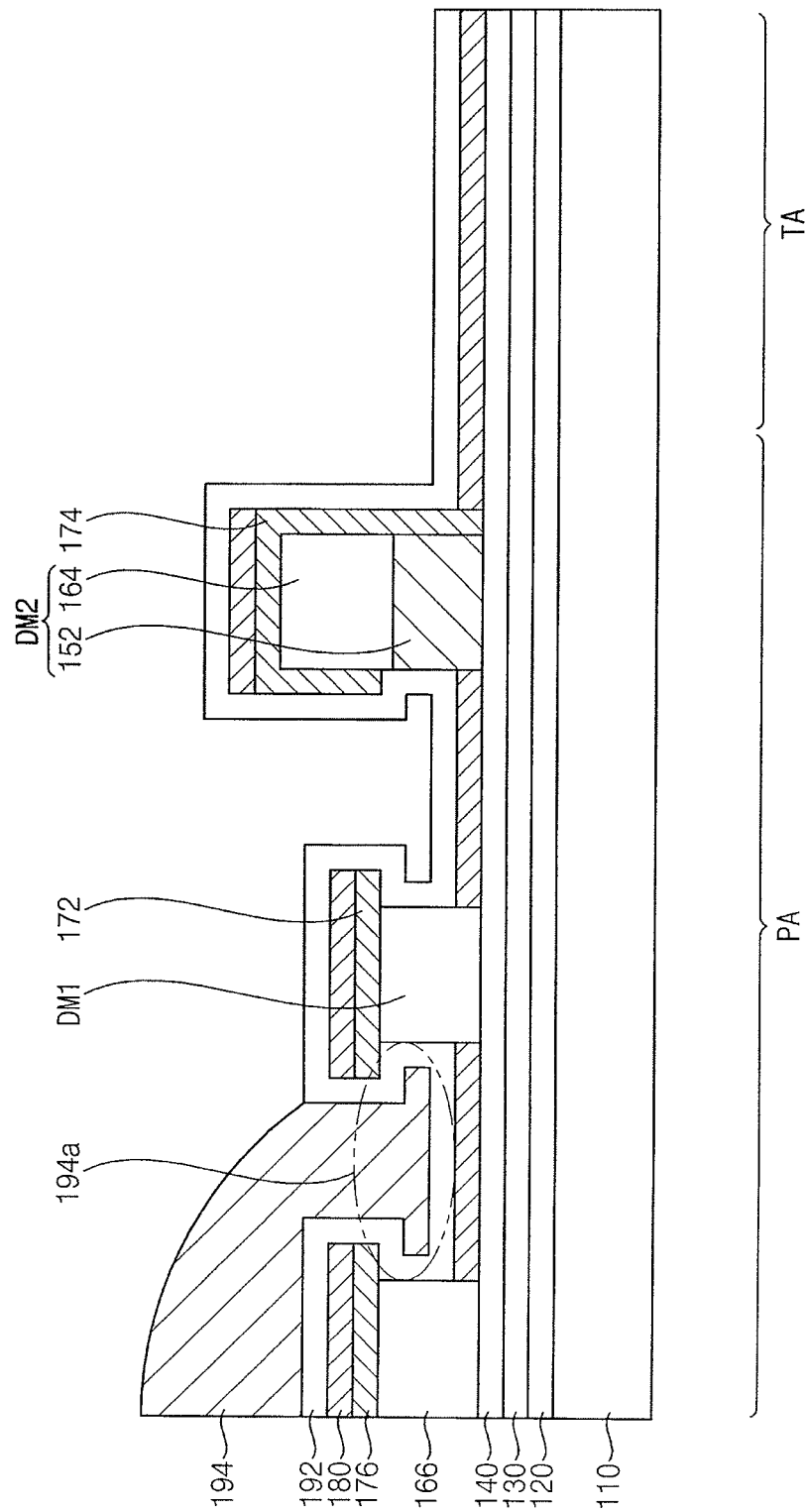

ORGANIC LIGHT-EMITTING DISPLAY DEVICE AND METHOD OF MANUFACTURING THE SAME

CROSS-REFERENCE TO RELATED APPLICATION(S)

This is a continuation application based on currently U.S. patent application Ser. No. 16/854,063, filed Apr. 21, 2020, now U.S. Pat. No. 11,424,305, the disclosure of which is incorporated herein by reference in its entirety. U.S. patent application Ser. No. 16/854,063 is a continuation application of U.S. patent application Ser. No. 16/254,815, filed Jan. 23, 2019, now U.S. Pat. No. 10,644,087, issued May 5, 2020, the disclosure of which is incorporated herein by reference in its entirety. U.S. Pat. No. 10,644,087 claims priority benefit of Korean Patent Application No. 10-2018-0015724 under 35 U.S.C. § 119, filed on Feb. 8, 2018, the disclosure of which is incorporated herein by reference in its entirety for all purposes.

BACKGROUND

1. Field

Exemplary embodiments relate to a display device. More particularly, exemplary embodiments relate to an organic light-emitting display device and a method of manufacturing an organic light-emitting display device.

2. Description of the Related Art

Recently, organic light-emitting display devices are receiving attention as display devices displaying images. The organic light-emitting display device is able to emit light, while also having reduced weight and thickness because an individual light source may be omitted. Furthermore, the organic light-emitting display device has additional advantageous characteristics, e.g., low power consumption, high brightness, high response speed, etc.

SUMMARY

According to an exemplary embodiment, an organic light-emitting display device includes a through area, a display area surrounding the through area and including a light-emitting element array, and a peripheral area between the through area and the display area. The organic light-emitting display device includes a first dam structure, a first protruding pattern and a thin film encapsulation layer. The first dam structure is disposed on the peripheral area and has a shape surrounding the through area. The first protruding pattern is disposed on the first dam structure and protrudes toward the display area from the first dam structure to form an undercut. The thin film encapsulation layer continuously extends from the display area to the peripheral area and includes at least one organic layer. The organic layer includes a first filling portion filling at least a portion of a first receiving space between the first dam structure and a boundary portion extending from the display area. The first filling portion protrudes toward the first dam structure to be aligned with the undercut.

In an exemplary embodiment, the organic light-emitting display device further includes a second protruding pattern disposed on the boundary portion and protruding toward the through area from the boundary portion to form an undercut.

In an exemplary embodiment, the organic light-emitting display device further includes a second dam structure disposed between the first dam structure and the through area and having a shape surrounding the through area, and a third protruding pattern disposed on the second dam structure and protruding toward at least the first dam structure to form an undercut.

In an exemplary embodiment, the second dam structure has a height larger than a height of the first dam structure.

In an exemplary embodiment, the organic light-emitting display device further includes a common layer extending continuously from the display area to be disposed on the peripheral area. The common layer is disconnected at least between the first dam structure and the first receiving space.

In an exemplary embodiment, the common layer includes at least one selected from the group consisting of a metal, a lithium compound and an organic-light emitting material.

In an exemplary embodiment, the organic light-emitting display device further includes a second dam structure disposed between the first dam structure and the through area and having a shape surrounding the through area. The first protruding pattern is disposed continuously on the first dam structure and the second dam structure to cover a second receiving space between the first dam structure and the second dam structure.

In an exemplary embodiment, the first protruding pattern has a recess that is caved inwardly from an outer boundary of the first protruding pattern, in a plan view.

In an exemplary embodiment, the first dam structure includes an inlet connecting the first receiving space to the second receiving space.

In an exemplary embodiment, the organic layer of the thin film encapsulation layer further includes a second filling portion filling at least a portion of the second receiving space.

In an exemplary embodiment, the first protruding pattern includes an inorganic material.

According to an exemplary embodiment, a method of manufacturing an organic light-emitting display device is provided. According to the method, a boundary portion and a dam structure spaced apart from the boundary portion is formed on a peripheral area between a through area and a display area. The boundary portion extends from the display area. A sacrificial pattern adjacent to the dam structure is formed. A protruding pattern is formed to be disposed continuously on the sacrificial pattern and the dam structure. The sacrificial pattern is removed to form a receiving space and an undercut under the protruding pattern. A thin film encapsulation layer continuously extending from the display area to the peripheral area and including at least one organic layer is formed. The organic layer of the thin film encapsulation layer includes a filling portion filling at least a portion of the receiving space and protruding toward the dam structure to be aligned with the undercut.

According to an exemplary embodiment, an organic light-emitting display device includes a through area, a display area surrounding the through area and including a light-emitting element array, and a peripheral area between the through area and the display area. The organic light-emitting display device includes an undercut structure disposed on the peripheral area and having a shape surrounding the through area, and a thin film encapsulation layer continuously extending from the display area to the peripheral area and including at least one organic layer. The organic layer includes a filling portion filling at least a portion of a receiving space between the undercut structure and the display area, and aligned with the undercut.

BRIEF DESCRIPTION OF THE DRAWINGS

Features will become apparent to those of skill in the art by describing in detail exemplary embodiments with reference to the attached drawings, in which:

FIG. 2 illustrates a cross-sectional view of a display area DA of FIG. 1A.

FIGS. 5A, 5B, 5C and 6 illustrate cross-sectional views along line I-I' of FIG. 4.

FIGS. 7A to 7G illustrate cross-sectional views of stages in a method of manufacturing an organic light-emitting display device according to an exemplary embodiment.

DETAILED DESCRIPTION

Figure 1A:
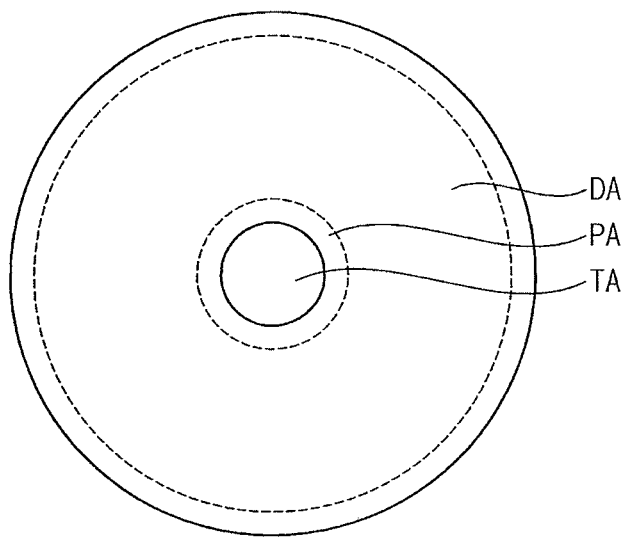
FIGS. 1A and 1B illustrate schematic plan views of an organic light-emitting display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, a schematic planar structure of an organic light-emitting display device according to an exemplary embodiment will be explained with reference to FIGS. 1A and 1B.

Figure 1B:
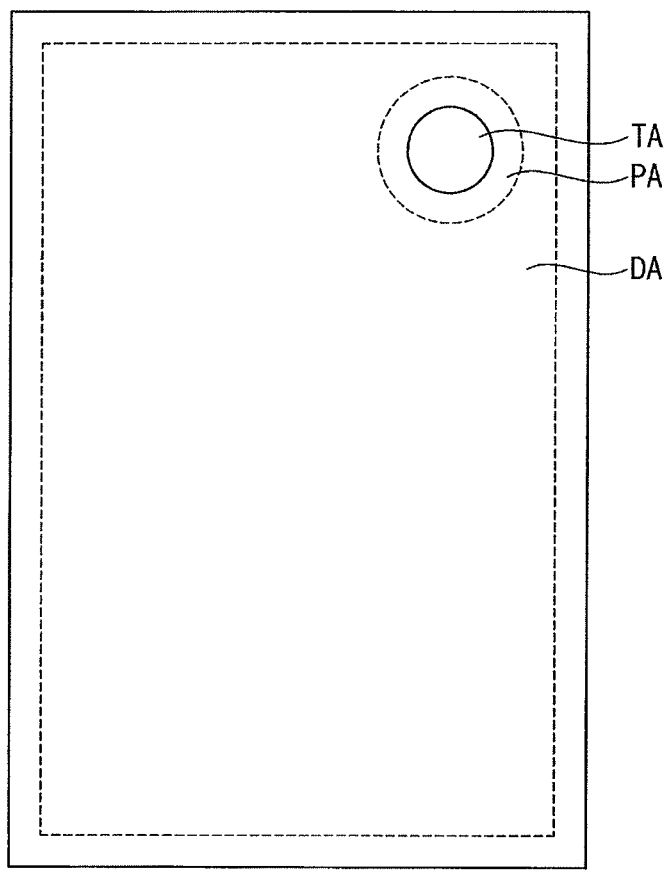

FIGS. 1A and 1B are plan views schematically illustrating an organic light-emitting display device according to an exemplary embodiment. FIG. 1A illustrates an organic light-emitting display device having a circular planar shape, and FIG. 1B illustrates an organic light-emitting display device having a rectangular planar shape. However, exemplary embodiments are not limited thereto, and may have various shapes.

Referring to FIGS. 1A and 1B, an organic light-emitting display device may include a display area DA, a through area TA, and a peripheral area PA. For example, as illustrated in FIGS. 1A and 1B, the through area TA may penetrate through the display area DA, and the peripheral area PA may completely surround a perimeter of the through area TA. For example, the through area TA may be centered with respect to the display area DA (FIG. 1A) or at an edge of the display area DA (FIG. 1B).

On the display area DA, a plurality of pixels emitting light may be disposed to display an image. For example, the display area DA may include an array of organic light-emitting diodes.

In the through area TA, an additional device, e.g., a camera, a sensor, a speaker or the like, may be disposed to add functions to the organic light-emitting display device. For example, a hole may be formed through a substrate and structures thereon to form the through area TA (e.g., FIG. 5A). A method for forming the through hole will be more fully explained below.

Even though FIGS. 1A and 1B show the through area TA as having a substantially circular shape, exemplary embodiments are not limited thereto. For example, the through area TA may have a polygonal shape, e.g., a rectangular shape, a triangular shape, or the like.

The peripheral area PA may be disposed between the display area DA and the through area TA. Thus, the peripheral area PA may surround the through area DA, and the display area DA may surround the peripheral area PA. Furthermore, a driving circuit for providing driving signals, e.g., a data signal, a gate signal or the like, to the pixels may be disposed on the peripheral area PA.

Figure 3:
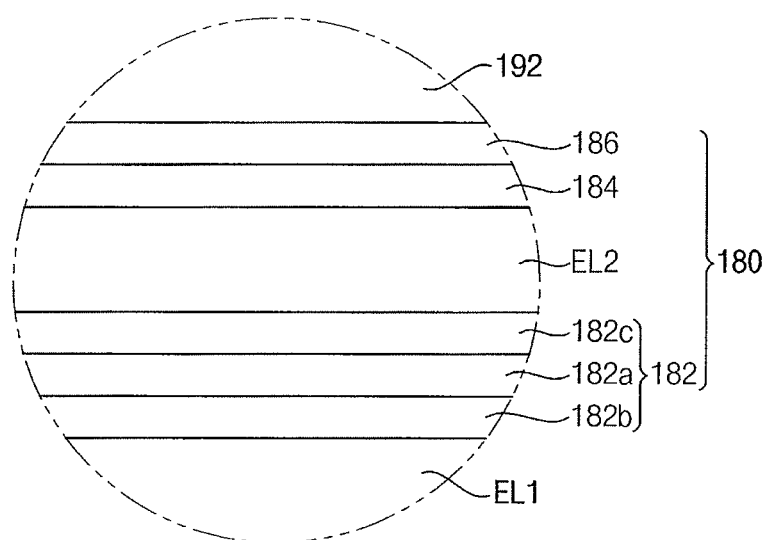
FIG. 3 illustrates an enlarged cross-sectional view of region 'A' of FIG. 2.

FIG. 2 is a cross-sectional view illustrating the display area DA of FIG. 1A. FIG. 3 is an enlarged cross-sectional view of the region 'A' in FIG. 2.

Referring to FIGS. 2 and 3, each pixel of the pixels disposed on the display area DA may include a driving transistor on a base substrate 110, an organic light-emitting diode electrically connected to the driving transistor, and a thin film encapsulation layer 190 covering the organic light-emitting diode. The driving transistor may include an active pattern AP, a gate electrode GE overlapping the active pattern AP, a source electrode SE electrically connected to the active pattern AP, and a drain electrode DE electrically connected to the active pattern AP and spaced apart from the source electrode SE.

For example, the base substrate 110 may include glass, quartz, silicon, a polymer or the like. For example, the polymer may include polyethylene terephthalate, polyethylene naphthalate, polyether ketone, polycarbonate, polyarylate, polyether sulfone, polyimide or a combination thereof.

A buffer layer 120 may be disposed on the base substrate 110. The buffer layer 120 may prevent or reduce penetration of impurities, humidity, or external gas from underneath of the base substrate 110, and may planarize an upper surface of the base substrate 110. For example, the buffer layer 120 may include an inorganic material, e.g., oxide, nitride or the like.

The active pattern AP may be disposed on the buffer layer 120. The active pattern AP may overlap the gate electrode GE. For example, the active pattern AP may include a semiconductor material, e.g., amorphous silicon, polycrystalline silicon (polysilicon), oxide semiconductor or the like. For example, when the active pattern AP includes polysilicon, at least a portion of the active pattern AP may be doped with impurities, e.g., n-type impurities or p-type impurities.

A first insulation layer 130 may be disposed on the active pattern AP. For example, the first insulation layer 130 may include silicon oxide, silicon nitride, silicon oxynitride, silicon carbide, silicon oxycarbide or a combination thereof. Furthermore, the first insulation layer 130 may include an insulating metal oxide, e.g., aluminum oxide, tantalum oxide, hafnium oxide, zirconium oxide, titanium oxide or the like. For example, the first insulation layer 130 may have a single-layer structure or a multiple-layer structure including, e.g., silicon nitride and/or silicon oxide.

The gate electrode GE may be disposed on the first insulation layer 130. For example, the gate electrode GE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layer structure or a multiple-layer structure including different metal layers.

A second insulation layer 140 may be disposed on the gate electrode GE and the first insulation layer 130. For example, the second insulation layer 140 may include silicon oxide, silicon nitride, silicon oxynitride, silicon carbide, silicon oxycarbide or a combination thereof. Furthermore, the second insulation layer 140 may include an insulating metal oxide, e.g., aluminum oxide, tantalum oxide, hafnium oxide, zirconium oxide, titanium oxide or the like.

A data metal pattern including the source electrode SE and the drain electrode DE may be disposed on the second insulation layer 140. The source electrode SE and the drain electrode DE may pass through the first insulation layer 130 and the second insulation layer 140 to contact the active pattern AP, respectively. For example, the source electrode SE and the drain electrode DE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layer structure or a multiple-layer structure including different metal layers.

A third insulation layer 150 may be disposed on the data metal pattern and the second insulation layer 140. For example, the third insulation layer 150 may include an inorganic insulation material, an organic insulation material or a combination thereof. For example, the organic insulation material may include polyimide, polyamide, acrylic resin, phenol resin, benzocyclobutene (BCB) or the like.

A first electrode EL1 of the organic light-emitting diode may be disposed on the third insulation layer 150. In an exemplary embodiment, the first electrode EL1 may function as an anode. For example, the first electrode EL1 may be formed as a transmitting electrode or a reflecting electrode according to an emission type of the display device. When the first electrode EL1 is a transmitting electrode, the first electrode EL1 may include, e.g., indium tin oxide, indium zinc oxide, zinc tin oxide, indium oxide, zinc oxide, tin oxide or the like. When the first electrode EL1 is a reflecting electrode, the first electrode EL1 may include, e.g., gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stack structure further including the material that may be used for the transmitting electrode.

A pixel-defining layer 160 may be disposed on the third insulation layer 150. The pixel-defining layer 160 may include an opening that exposes at least a portion of the first electrode EL1. For example, the pixel-defining layer 160 may include an organic insulation material. For example, the pixel-defining layer 160 and the third insulation layer 150 may be formed by coating a photoresist composition including an organic insulation material and patterning a coating layer using exposure-development processes.

A common layer 180 may be disposed on the pixel-defining layer and the first electrode EL1. The common layer 180 may include at least one layer extending continuously across a plurality of pixels on the display area DA. Thus, the common layer 180 may be formed substantially in the entire display area DA.

For example, referring to FIG. 3, the common layer 180 may include an organic light-emitting layer 182, a second electrode EL2, a capping layer 184, and a blocking layer 186. For example, the common layer 180 may include at least one of a metal, a lithium compound, and an organic-light emitting material.

The organic light-emitting layer 182 may be disposed on the first electrode EL1. The organic light-emitting layer 182 includes at least a light-emitting layer 182a, and may further include functional layers 182b and 182c contacting the light-emitting layer 182a. For example, the organic light-emitting layer 182 may include at least one of a first functional layer 182b disposed between the light-emitting layer 182a and the first electrode EL1, and a second functional layer 182c disposed between the light-emitting layer 182a and the second electrode EL2. For example, the first functional layer 182b may include at least one of a hole injection layer (HIL) and a hole transporting layer (HTL). The second functional layer 182c may include at least one of an electron transporting layer (ETL) and an electron injection layer (EIL). For example, the organic light-emitting layer 182 may include a low molecular weight organic compound or a high molecular weight organic compound.

In an exemplary embodiment, the organic light-emitting layer 182 may emit a red light, a green light or a blue light. In another exemplary embodiment, the organic light-emitting layer 182 may emit a white light. The organic light-emitting layer 182 emitting a white light may have a multiple-layer structure including a red-emitting layer, a green-emitting layer and a blue-emitting layer, or a single-layer structure including a mixture of a red-emitting material, a green-emitting material and a blue-emitting material.

The second electrode EL2 may be disposed on the organic light-emitting layer 182. In an exemplary embodiment, the second electrode EL2 may function as a cathode. For example, the second electrode EL2 may be formed as a transmitting electrode or a reflecting electrode according to an emission type of the display device. For example, when the second electrode EL2 is a transmitting electrode, the second electrode EL2 may include lithium (Li), calcium (Ca), lithium fluoride (LiF), aluminum (Al), magnesium (Mg), or a combination thereof, and the display device may further include a sub electrode or a bus electrode line, which may include, e.g., indium tin oxide, indium zinc oxide, zinc tin oxide, indium oxide, zinc oxide, tin oxide, or the like.

The capping layer 184 may be disposed on the second electrode EL2. The capping layer 184 may protect the organic light-emitting diode and may promote the light generated by the organic light-emitting diode to exit outwardly.

For example, the capping layer 184 may include an inorganic material or an organic material. For example, the inorganic material may include zinc oxide, tantalum oxide, zirconium oxide, titanium oxide or the like. For example, the organic material may include poly(3,4-ethylenedioxythiophene), PEDOT), 4,4'-bis[N-(3-methylphenyl)-N-phenylamino]biphenyl (TPD), 4,4',4"-tris[(3-methylphenyl) phenylamino]triphenylamine (m-MTDATA), 1,3,5-tris[N, N-bis(2-methylphenyl)-amino]-benzene (o-MTDAB), 1,3, 5-tris[N,N-bis(3-methylphenyl)-amino]-benzene (m-MTDAB) or the like.

The blocking layer 186 may be disposed on the capping layer 184. The blocking layer 186 may prevent damage to the organic light-emitting diode by plasma or the like from later processes. For example, the blocking layer 186 may include lithium fluoride, magnesium fluoride, calcium fluoride or the like.

The common layer 180 may include a portion of the organic light-emitting layer 182, the second electrode EL2, the capping layer 184, and the blocking layer 186. For example, the organic light-emitting layer 182 may be formed as a pattern corresponding to each pixels by an inkjet method or the like, e.g., the organic light-emitting layer 182 may include a plurality of discrete patterns respectively corresponding to the plurality of pixels, while each of the second electrode EL2, the capping layer 184, and the blocking layer 186 may be formed continuously over the plurality of pixels.

The thin film encapsulation layer 190 may be disposed on the common layer 180. The thin film encapsulation layer 190 may have a stack structure of an inorganic layer and an organic layer. For example, the thin film encapsulation layer 190 may include a first inorganic layer 192, a second inorganic layer 196, and an organic layer 194 disposed between the first and second inorganic layers 192 and 196.

For example, the organic layer 194 may include a cured resin, e.g., poly(meth)acrylate or the like. For example, the cured resin may be formed from cross-linking reaction of monomers. For example, the first and second inorganic layers 192 and 196 may include an inorganic material, e.g., silicon oxide, silicon nitride, silicon carbide, aluminum oxide, tantalum oxide, hafnium oxide, zirconium oxide, titanium oxide or the like.

Exemplary embodiments are not limited to the above-explained configuration of the thin film encapsulation layer 190. For example, the thin film encapsulation layer 190 may include at least two organic layers or at least three inorganic layers.

Figure 4:
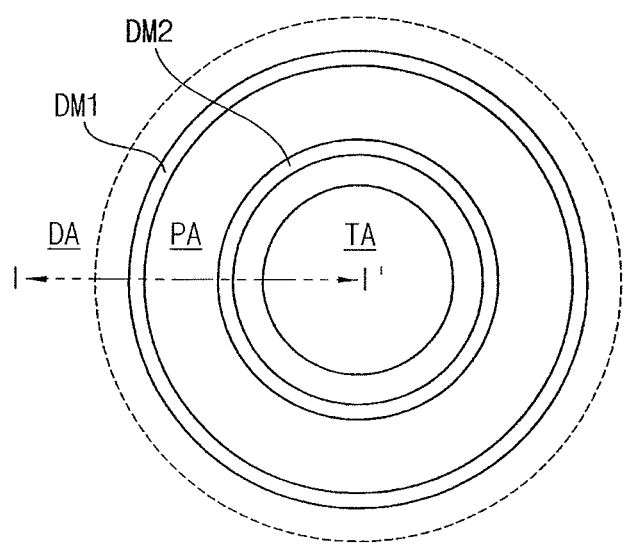
FIG. 4 illustrates an enlarged plan view of a through area and a peripheral area of FIG. 1A.
Figure 5B:
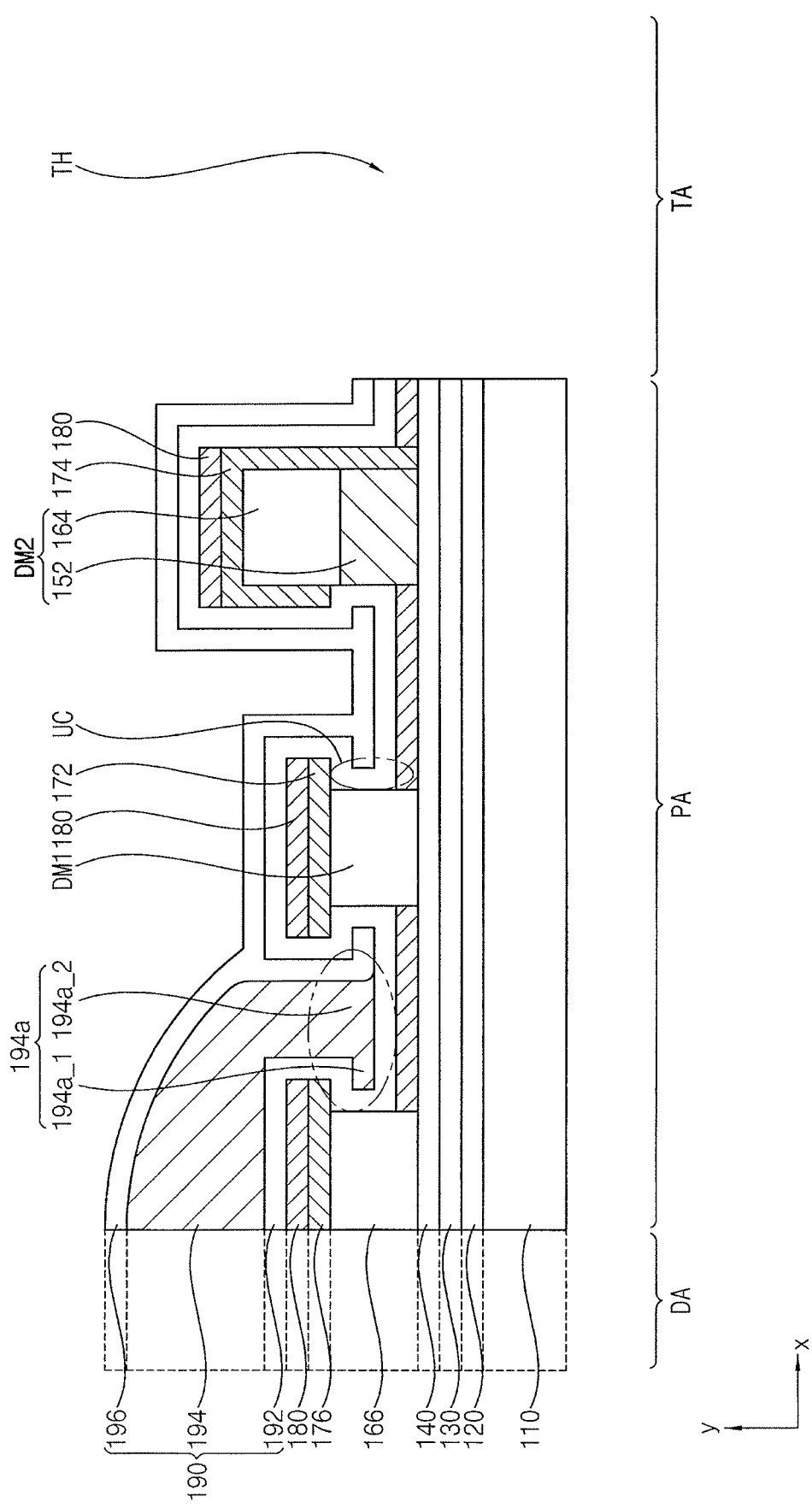
Figure 5C:
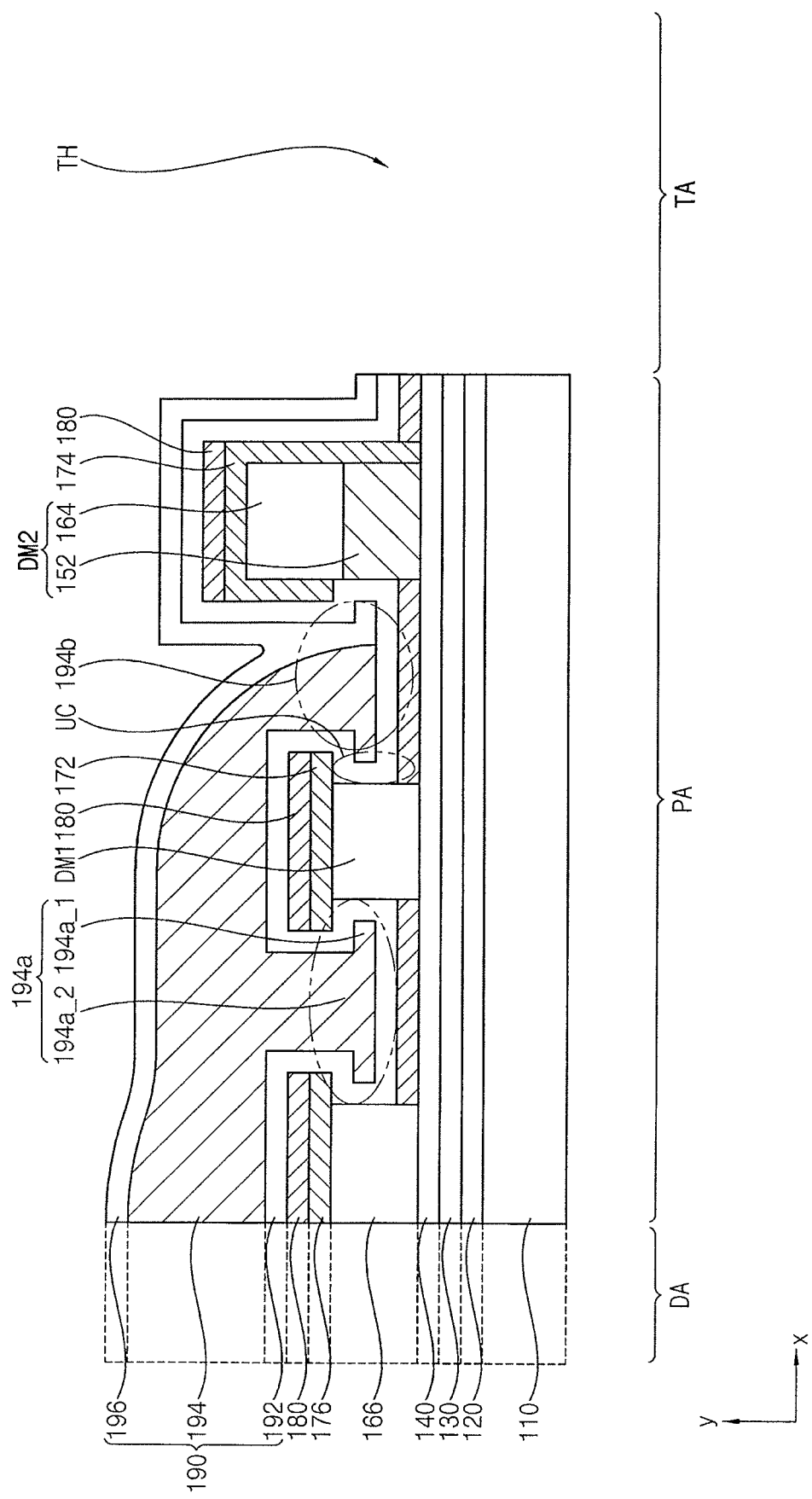

FIG. 4 is an enlarged plan view illustrating the through area TA and the peripheral area PA of FIG. 1A. FIGS. 5A, 5B and 5C are cross-sectional views along line I-I' of FIG. 4. It is noted that FIGS. 5A, 5B and 5C may be considered as an extension of the right side of FIG. 2.

Referring to FIGS. 4 and 5A, a dam structure is disposed on the peripheral area PA to surround the through area TA. For example, a first dam structure DM1 and a second dam structure DM2 may be disposed on the peripheral area PA. The second dam structure DM2 may be disposed between the first dam structure DM1 and the through area TA. In another exemplary embodiment, the dam structures may have a shape partially surrounding the through area TA.

On the peripheral area PA, the buffer layer 120, the first insulation layer 130, and the second insulation layer 140, which, e.g., continuously, extend from the display area DA, may be disposed on the base substrate 110. The first dam structure DM1 and the second dam structure DM2 may be disposed on the second insulation layer 140. Furthermore, a boundary portion 166, which extends from the display area DA, may be disposed on the peripheral area PA. The boundary portion 166 may be an edge of the insulation layer extending from the display area DA.

The first dam structure DM1 and the second dam structure DM2 may prevent a monomer from moving toward the through area TA in the process of forming the organic layer 194 of the thin film encapsulation layer 190.

In an exemplary embodiment, a height of the second dam structure DM2 may be larger than a height of the first dam structure DM1, e.g., relatively to a top surface of the base substrate 110. For example, the second dam structure DM2 having a height larger than a height of the first dam structure DM1 may stably prevent the monomer flowing over the first dam structure DM1 from further moving toward the through are TA. However, exemplary embodiments are not limited thereto, and a height of the second dam structure DM2 may be substantially equal to or less than a height of the first dam structure DM1.

The second dam structure DM2 may have a stack structure to have a height larger than the height of the first dam structure DM1. For example, the second dam structure DM2 may have a first supporting portion 152 and a second supporting portion 164 disposed on the first supporting portion 152.

The boundary portion 166, the first dam structure DM1, and the second dam structure DM2 may be parts of a layer structure disposed on the display area DA or may be formed therefrom. For example, the boundary portion 166, the first dam structure DM1, and the second supporting portion 164 of the second dam structure DM2 may be formed from a same layer as the pixel-defining layer 160, e.g., the boundary portion 166 may be an extension of the pixel-defining layer 160 in the peripheral area PA. Furthermore, the first supporting portion 152 may be formed from a same layer as the third insulation layer 150 of the display area DA. In an exemplary embodiment, the boundary portion 166, the first dam structure DM1, and the second dam structure DM2 may include an organic material. However, exemplary embodiments are not limited thereto, and the boundary portion 166 and the first and second dam structures DM1 and DM2 may be formed from various materials and various combination of layer structures.

Protruding patterns may be respectively formed on the first and second dam structures DM1 and DM2, e.g., to protrude horizontally along the x-direction beyond the first and second dam structures DM1 and DM2. The protruding patterns may protrude from, e.g., beyond, a side surface of the first and second dam structures DM1 and DM2 disposed under the protruding patterns to form an undercut region under the protruding patterns.

For example, as illustrated in FIG. 5A, a first protruding pattern 172 may be disposed on the first dam structure DM1. The first protruding pattern 172 may protrude along the xi direction from the first dam structure Dm1 at least toward the display area DA or the boundary portion 166 to form an undercut region UC. Furthermore, the first protruding pattern 172 may protrude toward the through area TA to form undercut regions UC at both sides of the first dam structure DM1 along the x direction. For example, the first protruding pattern 172 may have a flat shape, and a width of the first protruding pattern 172 along the x-direction may be larger than a width of the first dam structure DM1 along the x-direction, e.g., so an edge of the first protruding pattern 172 may overhang the entire perimeter of the first dam structure DM1 to define the undercut region UC to surround the first dam structure DM1 under the overhanging edge (a portion of the undercut region UC is circled on the right side of the first dam structure DM1 in FIG. 5A).

For example, as further illustrated in FIG. 5A, a second protruding pattern 176 may be disposed on the boundary portion 166. The second protruding pattern 176 may have a flat shape, and may protrude along the x direction from the boundary portion 166 at least toward the through area TA or the first dam structure DM1 to form an undercut region.

For example, as further illustrated in FIG. 5A, a third protruding pattern 174 may be disposed on the second dam structure DM2. For example, the third protruding pattern 174 may protrude along the x direction from the second dam structure DM2 at least toward the display area DA or the first dam structure DM1 to form an undercut region. For example, as illustrated in FIG. 5A, the third protruding pattern 174 may be conformal on the second supporting portion 164 of the second dam structure DM2, so a portion of the third protruding pattern 174 along a surface of the second supporting portion 164 facing the first dam structure DM1 may define the undercut region thereunderneath.

The common layer 180 may be disposed on the peripheral area PA, e.g., the common layer 180 may extend from the display area DA to the peripheral area PA. The common layer 180 may be disposed on the entirety of the peripheral area PA. For example, the common layer 180 may be disposed on the first through third protruding patterns 172, 174 and 176. A portion of the common layer 180 be disposed on an upper surface of the second insulation layer 140, e.g., between the boundary portion 166 and the first dam structure DM1 and between the first and second dam structures DM1 and DM2. As illustrated in FIG. 5A, the common layer 180 may not be continuous, e.g., may include disconnected or discontinuous portions at different heights and on different elements to cover the entirety of the peripheral area PA. For example, a portion of the common layer 180 disposed on the upper surface of the second insulation layer 140 may be disconnected with a portion of the common layer 180 disposed on the protruding patterns 172, 174 and 176.

The thin film encapsulation layer 190 extends from the display area DA to be disposed on the peripheral area PA. In an exemplary embodiment, the organic layer 194 of the thin film encapsulation layer 190 may be disposed partially on the peripheral area PA, and the first inorganic layer 192 and the second inorganic layer 196 of the thin film encapsulation layer 190 may be disposed entirely on the peripheral area PA.

For example, the first inorganic layer 192 of the thin film encapsulation layer 190 may continuously extend along an upper surface of the common layer 180 and side surfaces of the dam structures DM1 and DM2.

The organic layer 194 of the thin film encapsulation layer 190 may have a filling portion 194a that fills at least a portion of a first receiving space between the boundary portion 166 and the first dam structure DM1. Because the undercut region UC is formed by the first protruding pattern 172 disposed on the first dam structure DM1, the filling portion 194a may include a lower portion 194a_1 having a larger width along the x direction than an upper portion 194a_2 according to a shape of the undercut region UC. For example, the filling portion 194a may have a shape protruding toward the undercut region UC along the x direction. As a result, the filling portion 194a may be aligned and combined with the undercut region UC of the first dam structure DM1 along the y direction.

The second inorganic layer 196 of the thin film encapsulation layer 190 may continuously extend along an upper surface of the organic layer 194 and an upper surface of the first inorganic layer 192. For example, as illustrated in FIG. 5A, the first and second inorganic layers 192 and 196 may be in direct contact with each other beyond the edge of the organic layer 194, i.e., on the first and second dam structures DM1 and DM2.

Combination of the first dam structure DM1 and the organic layer 194 of the thin film encapsulation layer 190 may function as an anchor. Thus, when an external force is applied to the thin film encapsulation layer 190, separation of the organic layer 194 from the first inorganic layer 192 may be prevented, e.g., as the lower portion 194a_1 of the filling portion 194a of the organic layer 194 is anchored against the first inorganic layer 192 and the undercut region UC. Furthermore, such structure may prevent reflowing in the process of forming the organic layer 194 to improve reliability of a display device. Such advantages will be more fully explained below.

In an exemplary embodiment, the second protruding pattern 176 may be disposed on the boundary portion 166 to form another undercut region, as described previously. Thus, the filling portion 194a of the organic layer 194 may protrude toward the undercut region under the boundary portion 166. For example, effects of combined force increased by the undercut region and the filling portion 194a may be different depending on a direction, along which the protective tape is stripped. According to the exemplary embodiment, undercut regions combination is formed at both sides of the filling portion 194a. Thus, combination force may be increased in various directions.

However, exemplary embodiments are not limited thereto. For example, as illustrated in FIG. 5B, the filling portion 194a may partially fill the first receiving space between the boundary portion 166 and the first dam structure DM1. For example, undercut region combination may be formed at one side of the filing portion 194a, which is adjacent to the display area DA.

Furthermore, the organic layer 194 may extend over the first dam structure DM1 toward a second receiving space between the first dam structure DM1 and the second dam structure DM2. Therefore, an additional filling portion may be formed in the second receiving space. For example, as illustrated in FIG. 5C, the additional filling portion 194b disposed in the second receiving space may be combined with an undercut region formed by the first protruding pattern 172 or the third protruding pattern 174 to increase the combination force of the organic layer 194.

Figure 6:
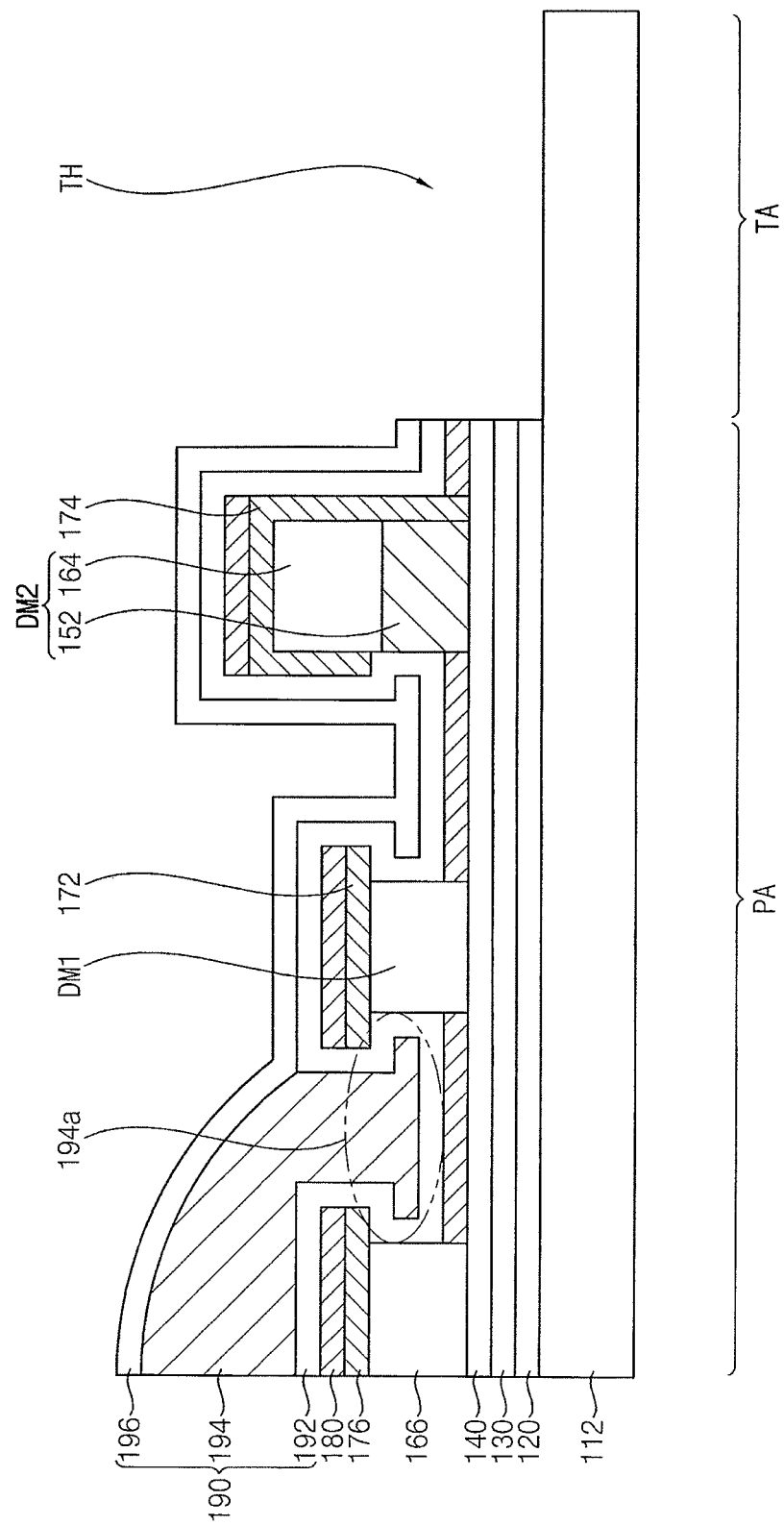

As illustrated in FIGS. 5A, 5B and 5C, a through hole TH may be formed at the organic light-emitting display device to define the through area TA. In an exemplary embodiment, all structures including the base substrate 110 may be removed from the through area TA. However, exemplary embodiments are not limited thereto. For example, as illustrated in FIG. 6, after the through hole TH is formed, the base substrate 110 may remain. In yet another example, the base substrate 110 may be removed, and a supporting substrate 112 may be provided in the through area TA to replace the removed base substrate 110.

Hereinafter, a method of manufacturing an organic light-emitting display device according to an exemplary embodiment will be explained with reference to accompanying drawings. FIGS. 7A to 7G are cross-sectional views illustrating stages in a method of manufacturing an organic light-emitting display device according to an exemplary embodiment. FIGS. 8A and 8B are enlarged cross-sectional views illustrating a sacrificial pattern and a protruding pattern in the method of manufacturing an organic light-emitting display device.

Referring to FIGS. 2 and 7A, the first dam structure DM1 and the second dam structure DM2 are formed on the base substrate 110 including the display area DA, the through area TA, and the peripheral area PA. The peripheral area PA may be disposed between the display area DA and the through area TA, as discussed previously and illustrated in FIGS. 1A and 1B.

In detail, the buffer layer 120 and first and second insulation layers 130 and 140 (hereinafter referred to as "insulation layers 120 through 140") may be disposed on the base substrate 110, e.g., during formation of the driving transistor illustrated in FIG. 2, and may extend, e.g., continuously, from the display area DA to the peripheral area PA and to the through area TA. The first dam structure DM1 and the second dam structure DM2 may be disposed on the insulation layers 120 through 140, e.g., after formation of the first electrode EL1 in the display area DA. The second dam structure DM2 may include the first supporting portion 152 and the second supporting portion 164 disposed on the first supporting portion 152.

In an exemplary embodiment, the second dam structure DM2 may have a shape surrounding the through area TA in a plan view, and the first dam structure DM1 may have a shape surrounding the second dam structure DM2. For example, each of the first dam structure DM1 and the second dam structure DM2 may have a continuous loop shape, respectively, and the loop shapes may be concentric (FIG. 4).

The first dam structure DM1 and the second dam structure DM2 may be portions of a layer structure disposed on the display area DA or may be formed therefrom. For example, the first dam structure DM1 and the second supporting portion 164 of the second dam structure DM2 may be formed from a same layer, e.g., and at the same time, as the pixel-defining layer 160 in the display area DA. Furthermore, the first supporting portion 152 may be formed from a same layer, e.g., and at the same time, as the third insulation layer 150 of the display area DA.

The boundary portion 166 may be disposed on the peripheral area PA, and may extend from the display area DA. For example, the boundary portion 166 may be extend from the pixel-defining layer 160 and/or the third insulation layer 150 or may be formed therefrom. In an exemplary embodiment, the boundary portion 166 may extend from the pixel-defining layer 160.

For example, a photoresist composition may be coated on the insulation layers, e.g., on the second insulation layer 140, and developed to form the boundary portion 166, the first dam structure DM1, and the second dam structure DM2 in the peripheral area PA. For example, the same photoresist composition may be developed to simultaneously form the pixel-defining layer 160 in the display area DA.

Referring to FIG. 7B, a first sacrificial pattern SL1 is formed between the boundary portion 166 and the first dam structure DM1, and a second sacrificial pattern SL2 is formed between the first dam structure DM1 and the second dam structure DM2. For example, the first sacrificial pattern SL1 and the second sacrificial pattern SL2 may be formed by a printing method, e.g., an inkjet printing method. For example, a positive type photoresist composition or a negative type photoresist composition may be provided by an inkjet printing method to form the first sacrificial pattern SL1 and the second sacrificial pattern SL2.

Figure 7C:
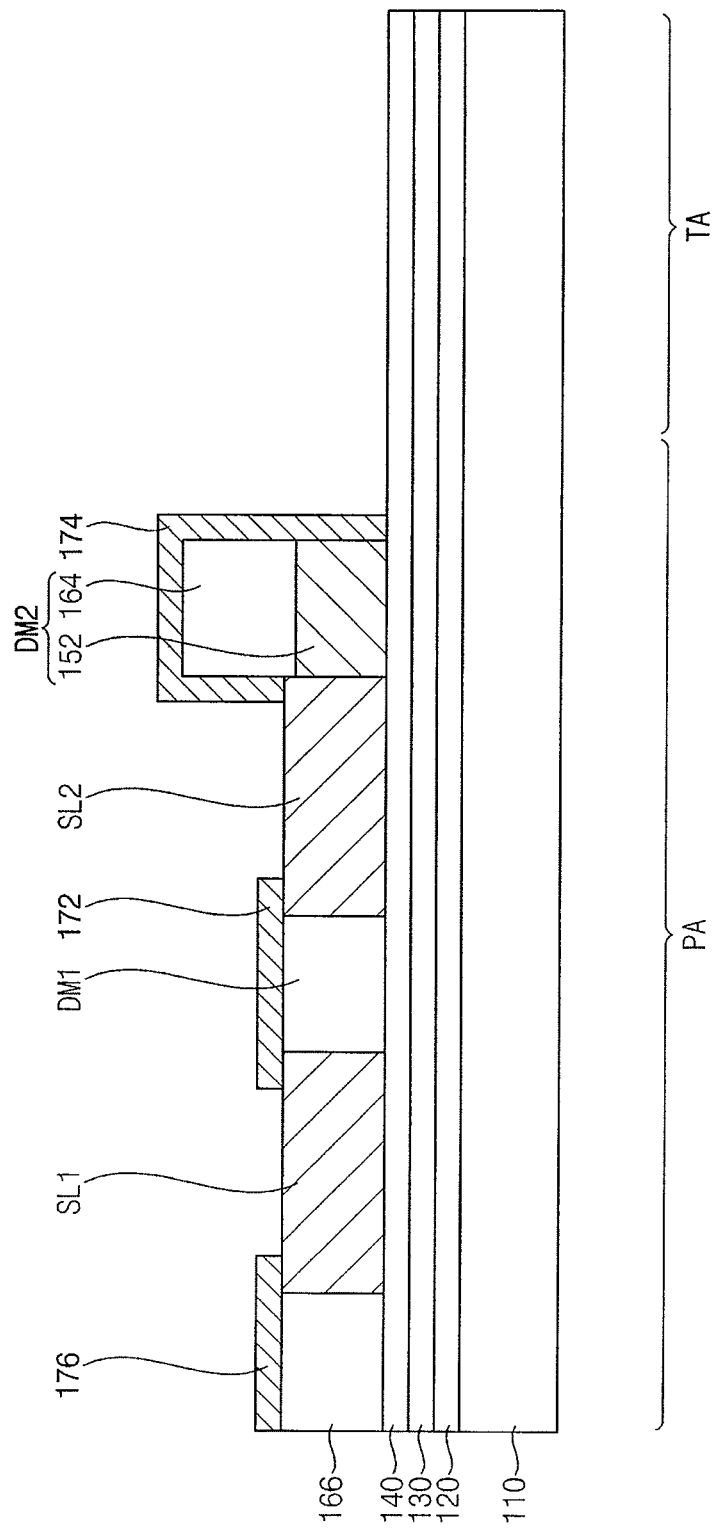
Figure 8A:
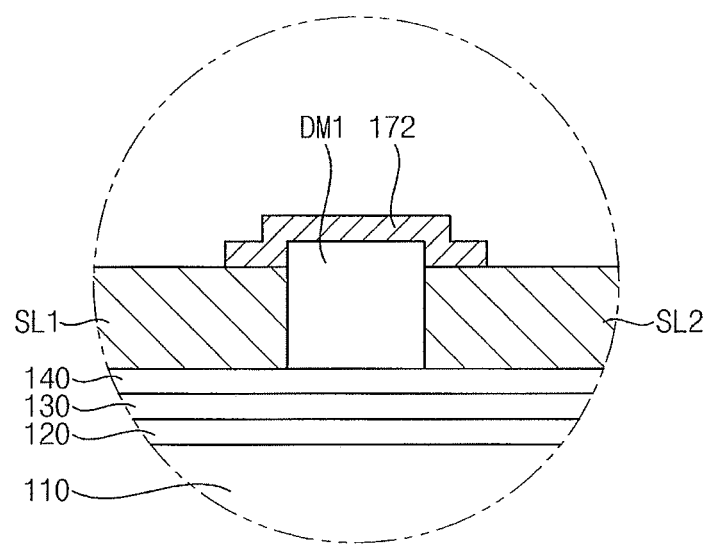
FIGS. 8A and 8B illustrate enlarged cross-sectional views of a sacrificial pattern and a protruding pattern in a method of manufacturing an organic light-emitting display device.
Figure 8B:
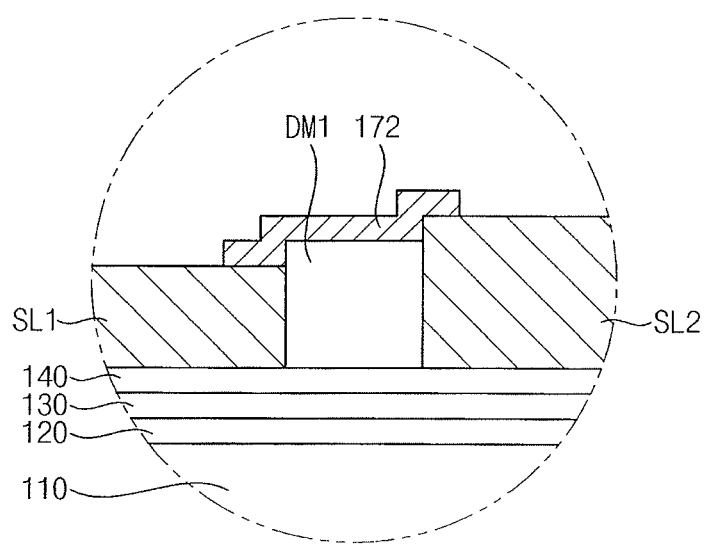

Referring to FIG. 7C, protruding patterns are formed on the boundary portion 166, the first dam structure DM1, and the second dam structure DM2. For example, the protruding patterns may include the first protruding pattern 172 disposed on the first dam structure DM1, the second protruding pattern 176 disposed on the boundary portion 166, and the third protruding pattern 174 disposed on the second dam structure DM2.

At least a portion of the protruding pattern may be disposed on the sacrificial pattern adjacent thereto. Thus, the protruding pattern may cover at least a portion of an upper surface of the sacrificial pattern. For example, a first end of the first protruding pattern 172 may be disposed on the first sacrificial pattern SL1, and a second end of the first protruding pattern 172 may be disposed on the second sacrificial pattern SL2. An end of the second protruding pattern 176 may be disposed on the first sacrificial pattern SL1. An end of the third protruding pattern 174 may be disposed on the second sacrificial pattern SL2.

The protruding patterns 172, 174 and 176 may form undercut regions after the sacrificial patterns SL1 and SL2 are removed. The protruding patterns 172, 174 and 176 may include various materials. For example, the protruding patterns 172, 174 and 176 may include an inorganic material, e.g., silicon oxide, silicon nitride, silicon carbide, aluminum oxide, tantalum oxide, hafnium oxide, zirconium oxide, titanium oxide or the like.

When the protruding patterns 172, 174 and 176 are formed, a structure on the display area DA needs to be protected. For example, the protruding patterns 172, 174 and 176 may be formed by a deposition process using a mask having an opening corresponding to an area where the protruding patterns 172, 174 and 176 are formed.

Referring to FIG. 7D, the first sacrificial pattern SL1 and the second sacrificial pattern SL2 are removed. For example, a developer, a stripper or the like may be provided to remove the first sacrificial pattern SL1 and the second sacrificial pattern SL2.

The protruding patterns 172, 174 and 176 cover at least a portion of an upper surface of first sacrificial pattern SL1 and the second sacrificial pattern SL2. Thus, as the first sacrificial pattern SL1 and the second sacrificial pattern SL2 are removed, the undercut regions UC may be formed under the protruding patterns 172, 174 and 176, e.g., region defined by overhanging portions of the protruding patterns 172, 174 and 176.

A space between the first dam structure DM1 and the boundary portion 166 may be defined as a first receiving space RC1, and a space between the first dam structure DM1 and the second dam structure DM2 may be defined as a second receiving space RC2.

Figure 7E:
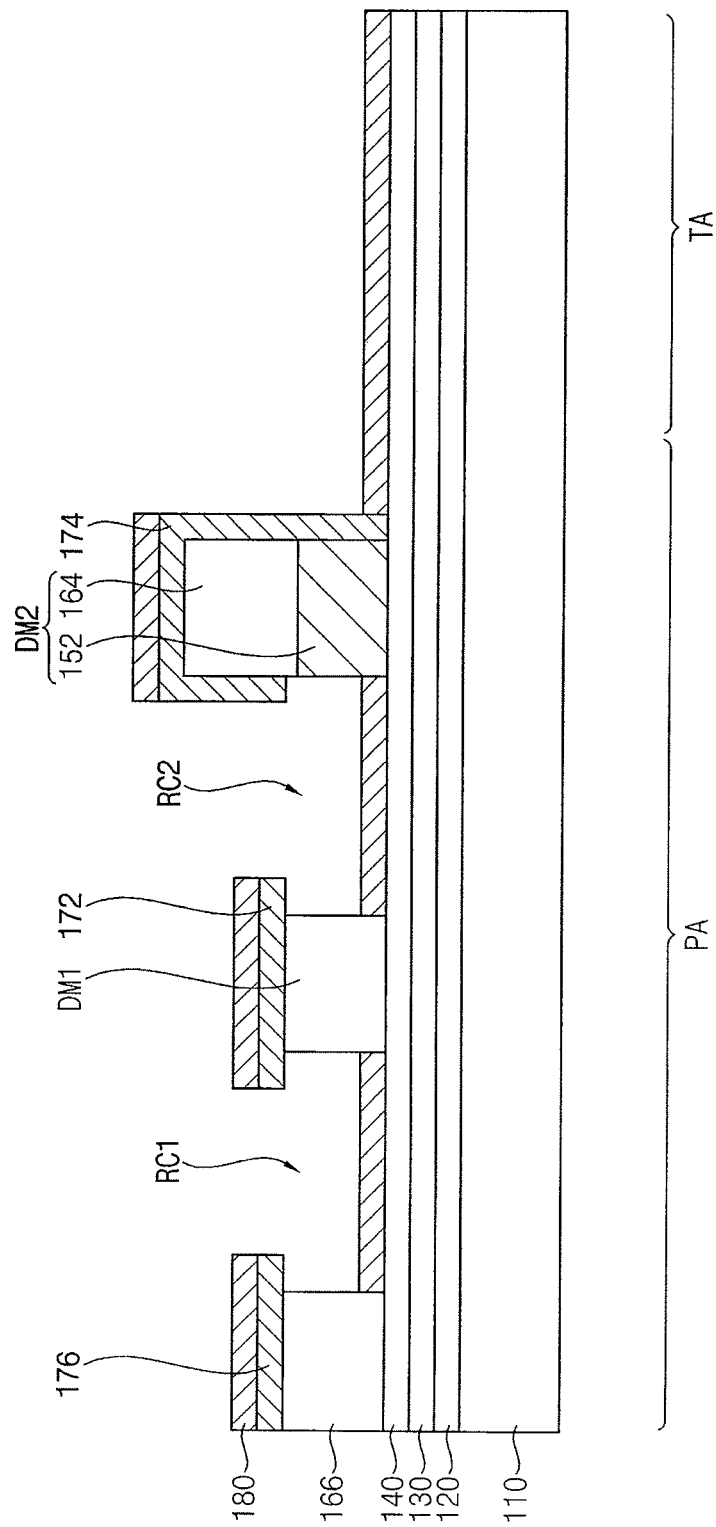

Referring to FIG. 7E, the common layer 180 may be formed on the peripheral area PA. The common layer 180 may be formed on the display area DA as well as on the peripheral area PA. The common layer 180 may include at least one of the organic light-emitting layer 182, the second electrode EL2, the capping layer 184, and the blocking layer 186, as illustrated in FIG. 3.

The common layer 180 may be formed by, e.g., an inkjet printing method, a screen printing method, a deposition method or the like, and may be formed by combination of different methods. In an exemplary embodiment, the common layer 180 may be a vacuum deposition method.

The common layer 180 may be formed entirely on the peripheral area PA. For example, the common layer 180 may be formed on the protruding patterns 172, 174 and 176 and in the first receiving space RC1 and the second receiving space RC2. The common layer 180 may be disconnected by an undercut structure on the peripheral area PA. For example, a portion disposed on the protruding patterns 172, 174 and 176 may be disconnected with a portion disposed in the first receiving space RC1 and the second receiving space RC2.

If the common layer 180 is not disconnected, humidity or the like may penetrate into the display area from an end of the common layer 180, or separation may be easily progressed at an interlayer interface in the common layer 180o or at an interface between the common layer 180 and other layers. In an exemplary embodiment, the common layer 180 on the peripheral area PA is disconnected by the undercut structure. Thus, progression of separation or penetration of humidity may be prevented. Thus, reliability of a display device may be maintained.

Figure 7G:
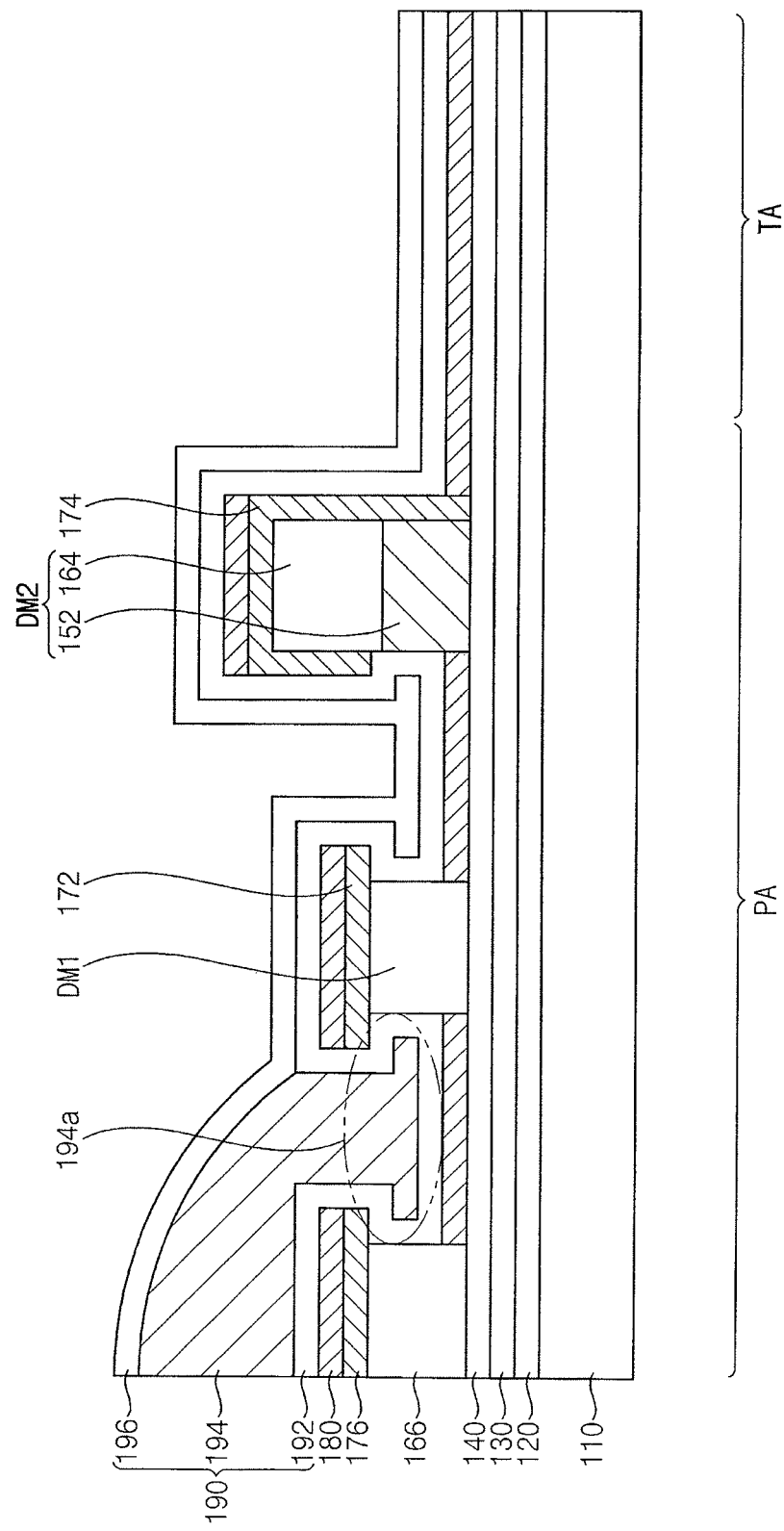

Referring to FIGS. 7F and 7G, the thin film encapsulation layer 190 is formed on the peripheral area PA. The thin film encapsulation layer 190 may have a stack structure in which an organic layer and an inorganic layer are alternately stacked. The thin film encapsulation layer 190 may be formed on the display area DA as well as on the peripheral area PA. For example, the thin film encapsulation layer 190 may include the first inorganic layer 192, the second inorganic layer 196, and the organic layer 194 disposed between the first and second inorganic layers 192 and 196.

For example, the first inorganic layer 192 may include an inorganic material, e.g., silicon oxide, silicon nitride, silicon carbide, aluminum oxide, tantalum oxide, hafnium oxide, zirconium oxide, titanium oxide or the like, and may be formed by a chemical vaporization deposition method. For example, the first inorganic layer 192 may be formed conformally on an upper surface and a side surface of the structures disposed on the peripheral area PA.

The organic layer 194 may be formed on the first inorganic layer 192. For example, a monomer composition may be provided on an upper surface of the first inorganic layer 192 to form the organic layer 194.

The monomer composition may include a curable monomer. For example, the curable monomer may contain at least one curable functional group. For example, the curable functional group may include a vinyl group, a (meth) acrylate group, an epoxy group or the like.

For example, the curable monomer may include ethyleneglycol di(meth)acrylate, hexanediol di(meth)acrylate, heptanediol di(meth)acrylate, octanediol di(meth)acrylate, nonanediol di(meth)acrylate, decanediol di(meth)acrylate, triethylpropane tri(meth)acrylate, pentaerythritol tri(meth) acrylate, pentaerythritol tetra(meth)acrylate, dipentaerythritol tri(meth)acrylate, dipentaerythritol tetra(meth)acrylate, dipentaerythritol penta(meth)acrylate, dipentaerythritol hexa(meth)acrylate or the like.

The monomer composition may further include an initiator such as a photo initiator or the like.

The monomer composition may be provided on the first inorganic layer 192 by, e.g., an inkjet printing method, a screen printing method or the like. A portion of the monomer composition may flow in the first receiving space RC1. Thus, the organic layer 194 formed from the monomer composition may include the filling portion 194a filling the first receiving space RC1 between the first dam structure DM1 and the boundary portion 166.

The organic layer 194 may be weakened by humidity or the like. Thus, the organic layer 194 needs to be controlled so that a boundary of the organic layer 194 disposed on the peripheral area PA does not have an edge exposed at the through area TA or the like. In an exemplary embodiment, the first and second dam structures DM1 and DM2 are provided to prevent reflowing of the monomer composition in the process of forming the organic layer 194, and the undercut regions UC are formed at the first and second dam structures DM1 and DM2. The undercut region UC increases a length of an interface contacting the monomer composition or a wetting length to effectively prevent or substantially minimize the monomer composition from flowing over the dam structures.

The monomer composition may be preferably controlled not to flow over the first dam structure DM1. However, even if the monomer composition flows over the first dam structure DM1, the monomer composition may be prevented from flowing into the through area TA by the second dam structure DM2 and the undercut region UC formed by the third protruding pattern 174. Furthermore, as the thin film encapsulation layer 190 includes at least two organic layers so that the monomer composition is provided on the second inorganic layer 196, the monomer composition may be prevented from reflowing by the second dam structure DM2.

As described previously, the organic layer 194 has a low interfacial adhesion to the inorganic layer. However, in an exemplary embodiment, because the organic layer 194 includes the filling portion 194a disposed between the first dam structure DM1 and the boundary portion 166 and aligned with the undercut region UC of the first dam structure DM1, separation of the organic layer 194 due to an external force may be prevented.

The monomer composition may be cured in a following process to form a cured resin.

The second inorganic layer 196 may be formed on the organic layer 194. The second inorganic layer 196 may include a same material as the first inorganic layer 192 and may be formed by a same method.

In order to form the through area TA, the through hole TH corresponding to the through area TA may be formed. For example, as illustrated in FIG. 5A, the base substrate 110 and a layer structure disposed on the base substrate 110 may be removed from the through area TA. For example, the through hole TH may be formed by a laser or the like.

In an exemplary embodiment, an undercut structure is formed on a peripheral area between a through area and a display area. Thus, a common layer formed thereon may be disconnected, and reflowing of a monomer composition for forming an organic layer of a thin film encapsulation layer may be effectively inhibited. Furthermore, alignment combination between the undercut structure and the organic layer is formed thereby preventing separation of the organic layer.

In an exemplary embodiment, a single organic layer is disposed in the first receiving space RC1. However, exemplary embodiments are not limited thereto. When the thin film encapsulation layer 190 includes at least two organic layers, at least a portion of each organic layer may be disposed in the first receiving space RC1.

In the exemplary embodiment illustrated in FIGS. 7A to 7G, the sacrificial pattern having a same height as the dam structure is illustrated. However, exemplary embodiments are not limited thereto. The sacrificial pattern may have various heights and combinations. Therefore, a shape of the protruding pattern formed along surfaces of the dam structure and the sacrificial pattern may be variously changed.

For example, as illustrated in FIG. 8A, the first sacrificial pattern SL1 and the second sacrificial pattern SL2 may have a height smaller than the first dam structure DM1. As a result, the protruding pattern 172 may partially cover a side surface of the first dam structure DM1.

Furthermore, as illustrated in FIG. 8B, the first sacrificial pattern SL1 may have a height smaller than the first dam structure DM1, and the second sacrificial pattern SL2 may have a height larger than the first dam structure DM1. As a result, the protruding pattern 172 may have a step shape.

A length of an undercut formed by the protruding pattern 172, which may be a protruding length of the protruding pattern 172, may be appropriately adjusted in view of a pattern shape, following processes or the like.

Figure 9:
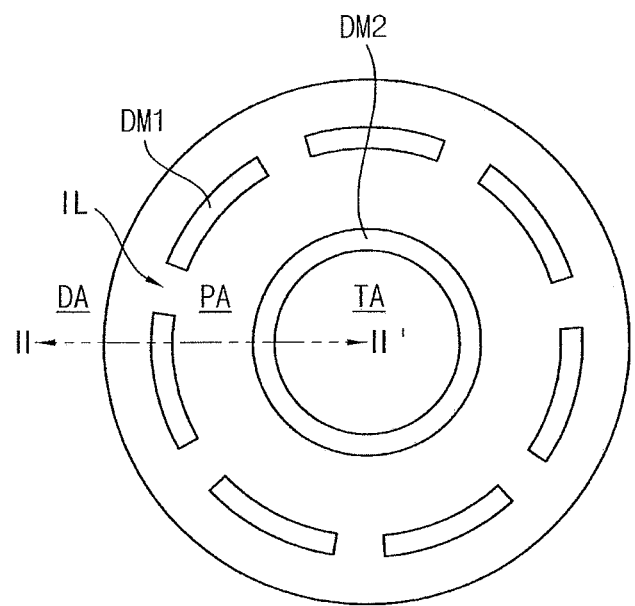
FIG. 9 illustrates an enlarged plan view of a through area and a peripheral area of an organic light-emitting display device according to an exemplary embodiment.
Figure 10:
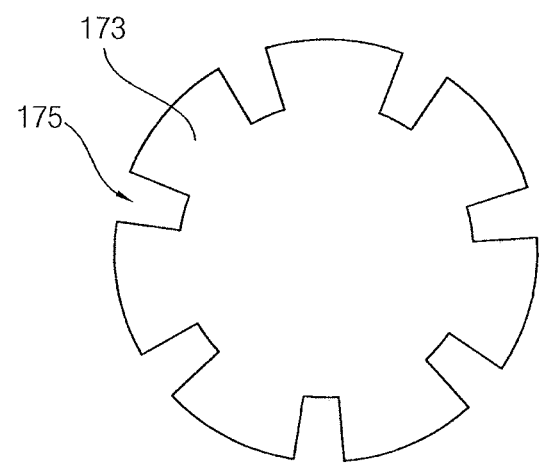
FIG. 10 illustrates an enlarged plan view of a protruding pattern of an organic light-emitting display device according to an exemplary embodiment.

FIG. 9 is an enlarged plan view illustrating the through area TA and the peripheral area PA of an organic light-emitting display device according to an exemplary embodiment. FIG. 10 is an enlarged plan view illustrating a protruding pattern of an organic light-emitting display device according to an exemplary embodiment. FIG. 11A to FIG. 11E are cross-sectional views illustrating stages in a method of manufacturing an organic light-emitting display device according to an exemplary embodiment along line II-II' of FIG. 9.

Figure 11A:
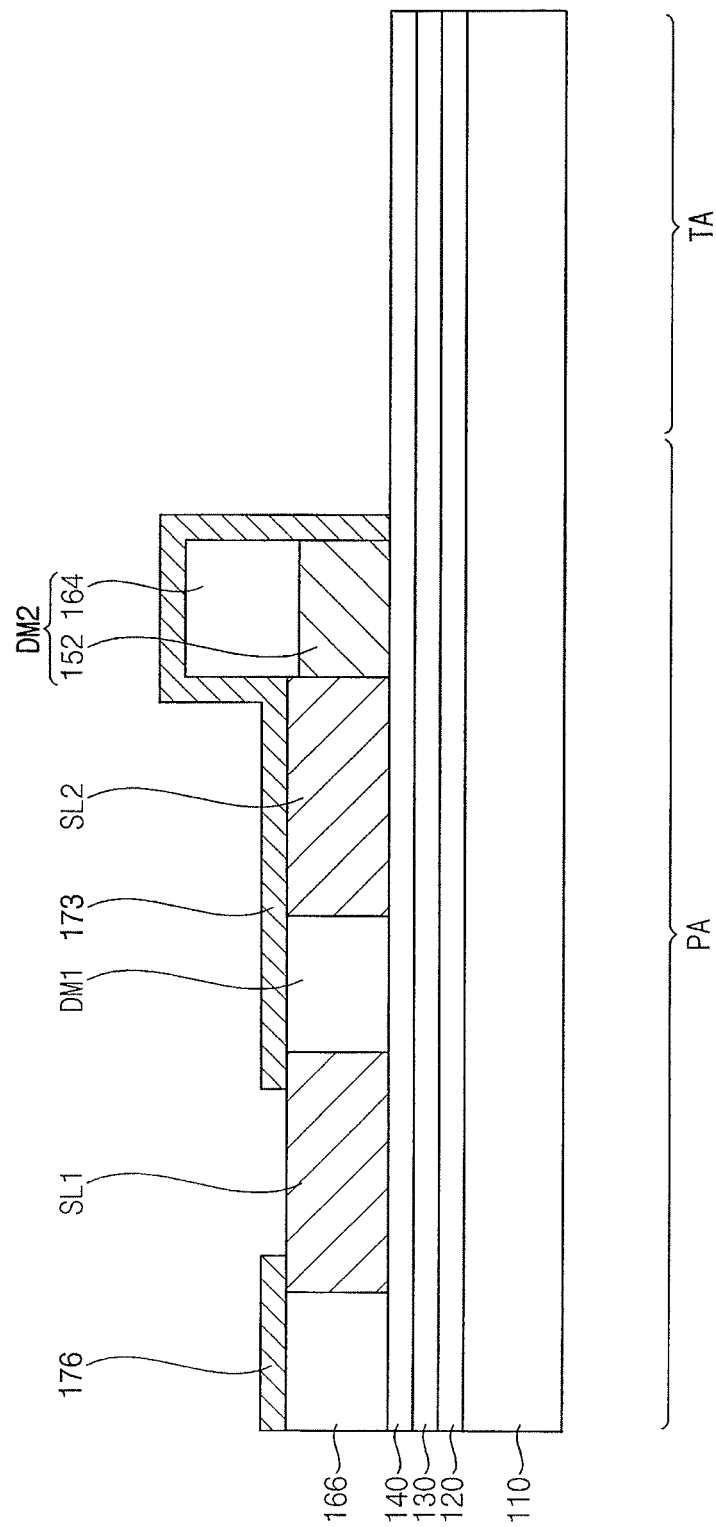
FIGS. 11A to 11E illustrate cross-sectional views along line II-II' of FIG. 9 of stages in a method of manufacturing an organic light-emitting display device according to an exemplary embodiment.

Referring to FIGS. 9, 10 and 11A, the boundary portion 166, the first dam structure DM1, and the second dam structure DM2 are formed on the peripheral area PA of the base substrate 110.

In an exemplary embodiment, the second dam structure DM2 may have a shape surrounding the through area TA. The first dam structure DM1 may have a shape surrounding the second dam structure DM2.

In an exemplary embodiment, the first dam structure DM1 may be discontinuously formed. For example, the first dam structure DM1 may include a plurality of patterns spaced apart from each other. Adjacent patterns may form an inlet IL therebetween. The second dam structure DM2 may have a continuous loop shape.

Thereafter, the first sacrificial pattern SL1 is formed between the boundary portion 166 and the first dam structure DM1, and the second sacrificial pattern SL2 is formed between the first dam structure DM1 and the second dam structure DM2. The first sacrificial pattern SL1 and the second sacrificial pattern SL2 may be connected to each other through the inlet IL of the first dam structure DM1. Thereafter, protruding patterns are formed on the first dam structure DM1, the boundary portion 166, and the second dam structure DM2.

In an exemplary embodiment, the protruding patterns may include a first protruding pattern 173 disposed continuously on the first dam structure DM1 and the second dam structure DM2, and the second protruding pattern 176 disposed on the boundary portion 166. The first protruding pattern 173 may continuously cover an upper surface of the first dam structure DM1, an upper surface of the second sacrificial pattern SL2, and an upper surface of the second dam structure DM2. The second protruding pattern 176 may cover a portion of an upper surface of the first sacrificial pattern SL1.

Referring to FIG. 10, the first protruding pattern 173 may have a recess 175 caved inwardly from an outer boundary in a plan view. The recess 175 may overlap the inlet IL of the first dam structure DM1.

Figure 11B:
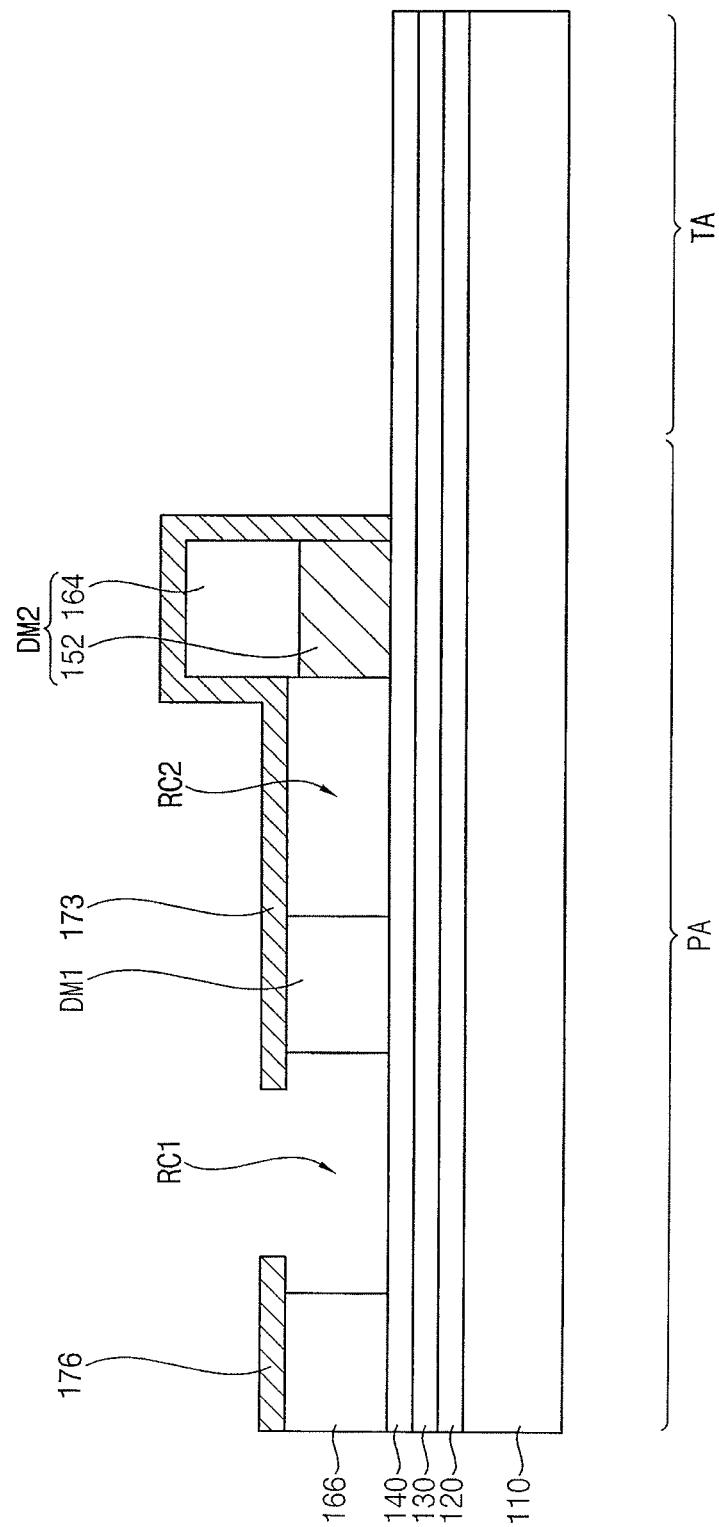

Referring to FIG. 11B, the first sacrificial pattern SL1 and the second sacrificial pattern SL2 are removed. As the first sacrificial pattern SL1 and the second sacrificial pattern SL2 are removed, an undercut region may be formed under the protruding patterns.

The first protruding pattern 173 may protrude toward the display area DA from the first dam structure DM1 to form an undercut region under the first protruding pattern 173. The second protruding pattern 176 may protrude toward the through area TA from the boundary portion 166 to form an undercut region under the second protruding pattern 176. A space between the first dam structure DM1 and the boundary portion 166 may be defined as the first receiving space RC1. A space between the first dam structure DM1 and the second dam structure DM2 may be defined as the second receiving space RC2. Because the first protruding pattern 173 is disposed continuously on the first dam structure DM1 and the second dam structure DM2, the first protruding pattern 173 may cover the second receiving space RC2.

Figure 11C:
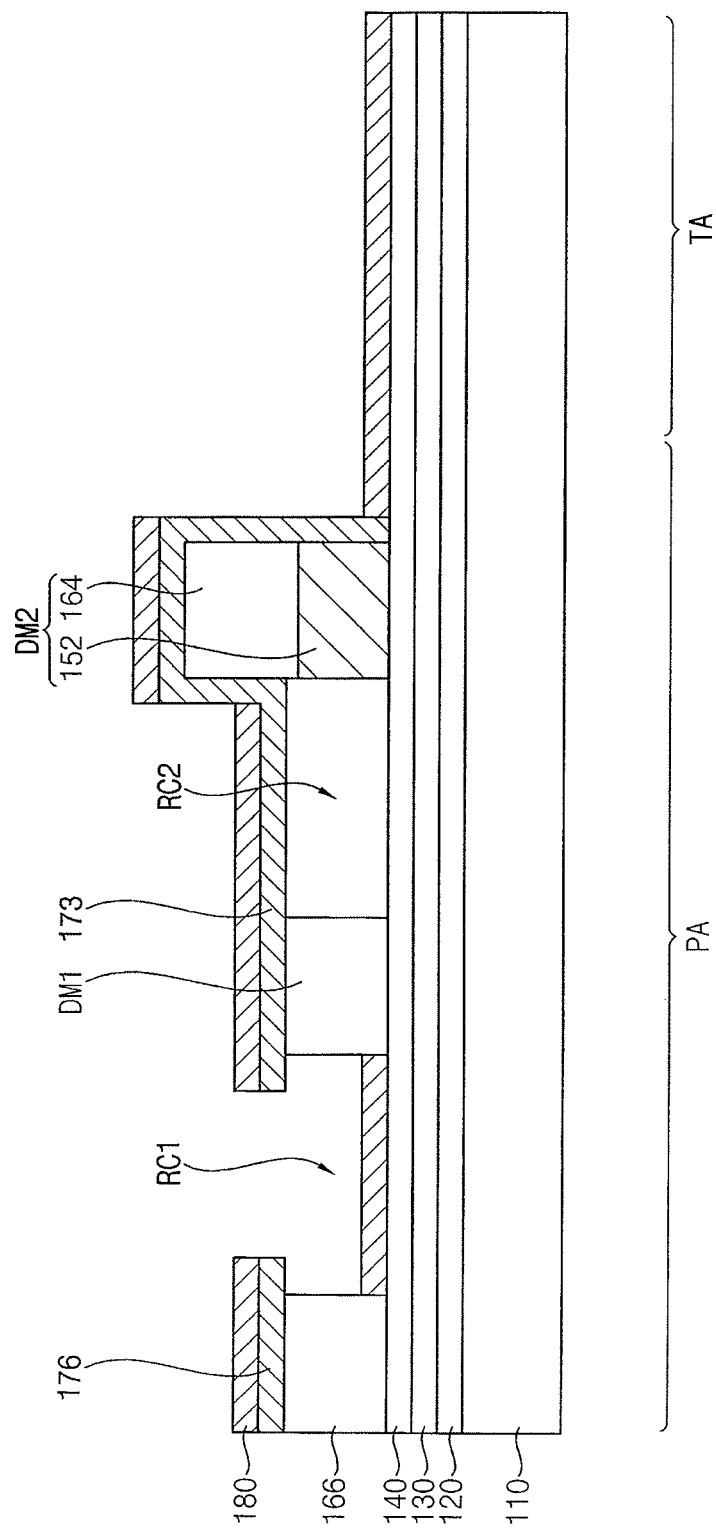

Referring to FIG. 11C, the common layer 180 may be formed on the peripheral area PA. The common layer 180 may be formed on the display area DA as well as on the peripheral area PA. The common layer 180 may include at least one of the organic light-emitting layer 182, the second electrode EL2, the capping layer 184, and the blocking layer 186, as illustrated in FIG. 3.

The common layer 180 may be disconnected by the undercut structure on the peripheral area PA. For example, a portion disposed on the protruding patterns 173 and 176 may be disconnected with a portion disposed in the first receiving space RC1.

Figure 11D:
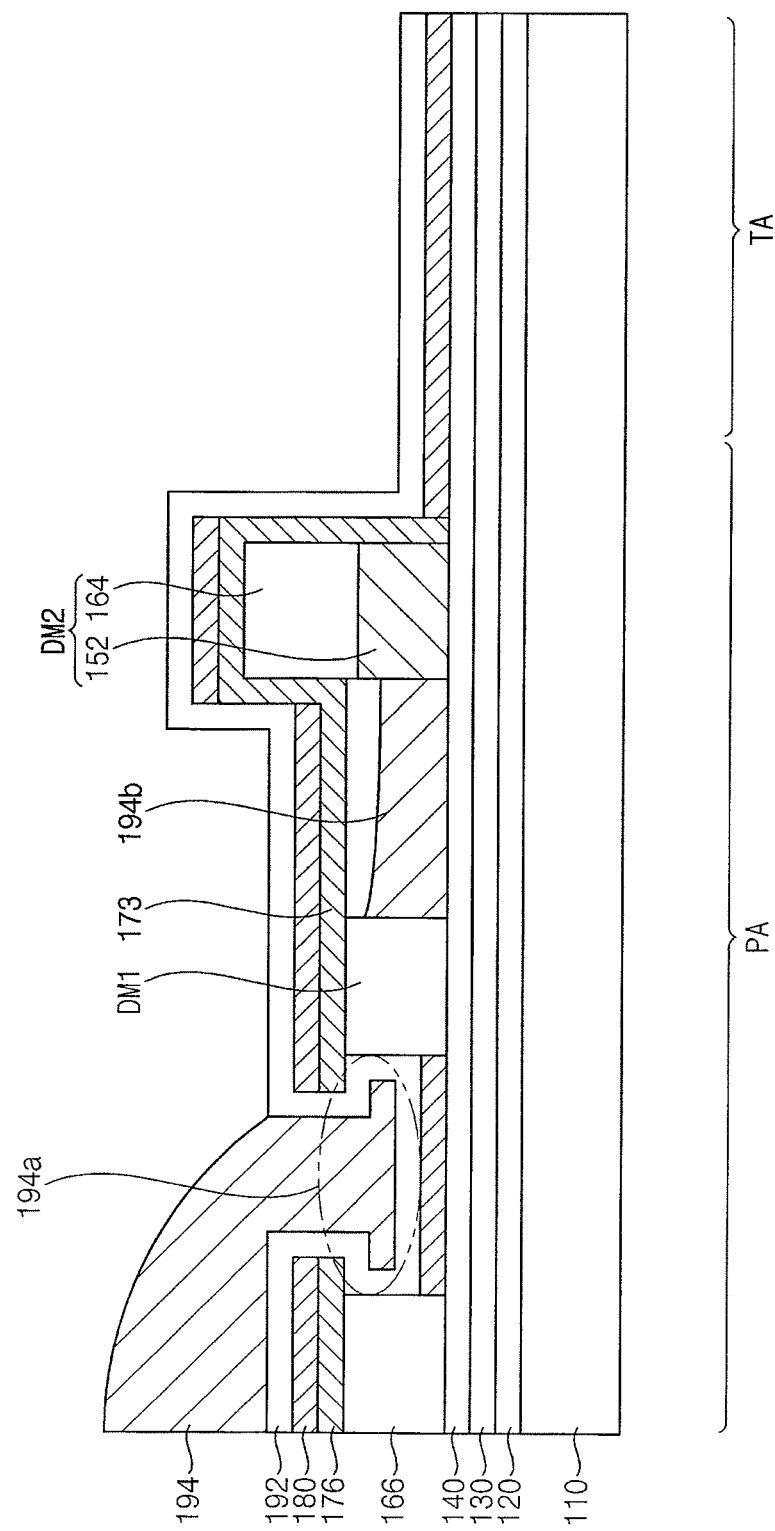
Figure 11E:
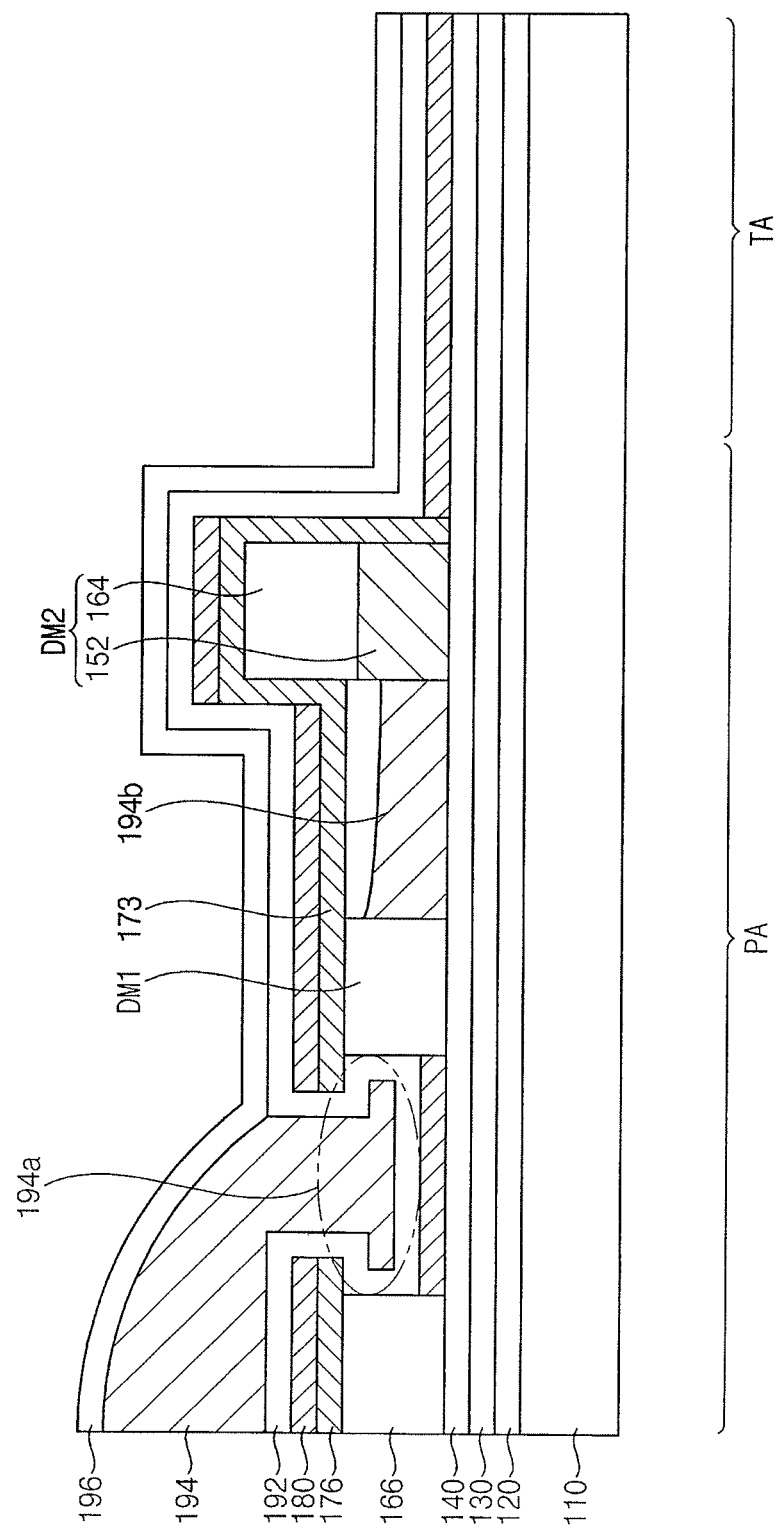

Referring to FIGS. 11D and 11E, the thin film encapsulation layer 190 is formed on the peripheral area PA. The thin film encapsulation layer 190 may have a stack structure in which an organic layer and an inorganic layer are alternately stacked. The thin film encapsulation layer 190 may be formed on the display area DA as well as on the peripheral area PA. For example, the thin film encapsulation layer 190 may include the first inorganic layer 192, the second inorganic layer 196, and the organic layer 194 disposed between the first inorganic layer 192 and the second inorganic layer 196.

The organic layer 194 may be formed on the first inorganic layer 192. For example, a monomer composition may be provided on an upper surface of the first inorganic layer 192.

The monomer composition may be provided on the first inorganic layer 192 by, e.g., an inkjet printing method, a screen printing method or the like. A portion of the monomer composition may flow in the first receiving space RC1. Furthermore, the monomer composition may flow in the second receiving space RC2 through the inlet IL of the first dam structure DM1 and the recess 175 of the first protruding pattern 173

Thus, the organic layer 194 formed from the monomer composition may include the filling portion 194a filling the first receiving space RC1 between the first dam structure DM1 and the boundary portion 166, and a second filling portion 194b filling the second receiving space RC2 between the first dam structure DM1 and the second dam structure DM2. As illustrated, the second filling portion 194b may partially fill in the second receiving space RC2.

The above structure may consecutively receive the monomer composition in the first receiving space RC1 and the second receiving space RC2. Thus, the monomer composition may be easily controlled. Furthermore, because a portion of the organic layer 194 is entirely covered by the first protruding pattern 173, effect for preventing separation of the organic layer 194 may be enhanced.

Exemplary embodiments may be applied to various display devices that may be used for, e.g., a television, a computer, a notebook computer, a tablet computer, a smart phone, a mobile phone, a navigator, a home appliance or the like.

By way of summation and review, in order to increase durability and to maintain performance, the organic light-emitting display device may be encapsulated to prevent or substantially minimize influence of humidity and oxygen from the exterior. For example, the organic light-emitting display device may be encapsulated by a thin film encapsulation layer. However, when a through area is formed in a display area, e.g., to add a camera, a sensor or the like, humidity may enter the display area from the through area, or separation may be caused at an interface of the thin film encapsulation layer or a common layer in the process of removing a protective tape, e.g., disposed on the thin film encapsulation layer, from the organic light-emitting display device.

In contrast, exemplary embodiments provide an organic light-emitting display device having improved reliability and a method of manufacturing the same. That is, according to exemplary embodiments, a dam structure with an undercut region is formed on a peripheral area between the through area and the display area, so that a common layer is disconnected. Further, reflowing of a monomer composition for forming an organic layer of the thin film encapsulation layer may be effectively inhibited. Furthermore, the undercut region is alignment, e.g., fitted and combined with the organic layer of the thin film encapsulation layer to prevent separation of the organic layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display device, comprising:
   a base substrate, the base substrate including a display area surrounding a through area, and a peripheral area between the through area and the display area;
   a light-emitting element array on the display area of the base substrate;
   at least one undercut structure on the peripheral area and surrounding the through area;
   a common layer extending so as to continuously cover the base substrate from the display area into the peripheral area so as to cover the at least one undercut structure; and
   a thin film encapsulation layer continuously extending from the display area to the peripheral area, wherein the common layer is discontinuous by the at least one undercut structure in the peripheral area.

2. The organic light-emitting display device as claimed in claim 1, wherein the at least one undercut structure includes a first undercut structure adjacent to a first receiving space, the first undercut structure including:
   a first dam structure on the peripheral area of the base substrate, the first dam structure having a shape surrounding the through area; and
   a first protruding pattern on the first dam structure, the first protruding pattern protruding toward the display area from the first dam structure to define a first undercut region.

3. The organic light-emitting display device as claimed in claim 2, wherein the common layer is discontinuous at least between the first dam structure and the first receiving space.

4. The organic light-emitting display device as claimed in claim 2, further comprising:
   an insulating layer disposed between the base substrate and the at least one undercut structure and continuously extending from the display area to the peripheral area, wherein
   the common layer is divided into a portion disposed on an upper surface of the first protruding pattern and a portion disposed on an upper surface of the insulating layer.

5. The organic light-emitting display device as claimed in claim 2, further comprising:
   a boundary portion extending from the display area toward the first dam structure; and
   a second protruding pattern on the boundary portion and protruding toward the through area from the boundary portion to form a second undercut region.

6. The organic light-emitting display device as claimed in claim 5, wherein the at least one undercut structure further includes a second undercut structure, the second undercut structure including:
   a second dam structure between the first dam structure and the through area, the second dam structure surrounding the through area; and
   a third protruding pattern on the second dam structure and protruding toward at least the first dam structure to form a third undercut region.

7. The organic light-emitting display device as claimed in claim 6, wherein the second dam structure has a height larger than a height of the first dam structure.

8. The organic light-emitting display device as claimed in claim 2, further comprising:
   a second dam structure between the first dam structure and the through area, the second dam structure surrounding the through area, wherein
   the first protruding pattern is continuous on the first dam structure and the second dam structure to cover a second receiving space between the first dam structure and the second dam structure.

9. The organic light-emitting display device as claimed in claim 8, wherein the first protruding pattern has a recess that is caved inwardly from an outer boundary of the first protruding pattern, in a plan view.

10. The organic light-emitting display device as claimed in claim 8, wherein the first dam structure includes an inlet connecting the first receiving space to the second receiving space.

11. The organic light-emitting display device as claimed in claim 1, wherein the common layer includes at least one of a metal, a lithium compound, and an organic-light emitting material.

12. The organic light-emitting display device as claimed in claim 2, wherein the first dam structure includes an organic material.

13. The organic light-emitting display device as claimed in claim 2, wherein the first protruding pattern includes an inorganic material-a-metal.

14. The organic light-emitting display device as claimed in claim 1, therein the common layer extends so as to continuously cover the base substrate from the display area to the through area.

15. An organic light-emitting display device, comprising:
   a base substrate, the base substrate including a display area surrounding a through area, and a peripheral area between the through area and the display area;
   a light-emitting element array on the display area of the base substrate;
   at least one undercut structure on the peripheral area and surrounding the through area;
   a common layer extending continuously from the display area into the peripheral area; and
   a thin film encapsulation layer continuously extending from the display area to the peripheral area, wherein
   the common layer is discontinuous by the at least one undercut structure in the peripheral area, the at least one undercut structure includes a first undercut structure adjacent to a first receiving space, the first undercut structure including:
- a first dam structure on the peripheral area of the base substrate, the first dam structure having a shape surrounding the through area; and
- a first protruding pattern on the first dam structure, the first protruding pattern protruding toward the display area from the first dam structure to define a first undercut region, and the first dam structure includes an organic material.

* * * * *